(12) United States Patent
Naumov et al.

(10) Patent No.: US 6,875,950 B2
(45) Date of Patent: *Apr. 5, 2005

(54) AUTOMATED LASER TRIMMING OF RESISTORS

(75) Inventors: Andrei Naumov, Ontario (CA); Anton Kitai, Ottawa (CA); Ian Miller, Ottawa (CA)

(73) Assignee: GSI Lumonics Corporation, Nashua, NH (US)

( * ) Notice: Subject to any disclaimer, the term of this patent is extended or adjusted under 35 U.S.C. 154(b) by 59 days.

This patent is subject to a terminal disclaimer.

(21) Appl. No.: 10/103,317

(22) Filed: Mar. 22, 2002

(65) Prior Publication Data

US 2003/0178396 A1 Sep. 25, 2003

(51) Int. Cl.[7] .............................................. B23H 26/38
(52) U.S. Cl. ............................ 219/121.69; 219/121.68; 338/195
(58) Field of Search ..................... 338/195; 219/121.68, 219/121.69

(56) References Cited

U.S. PATENT DOCUMENTS

| 4,381,441 A | * | 4/1983 | Desmarais et al. | |
| 4,998,207 A | * | 3/1991 | Postlewait | 219/121.69 |
| 5,103,075 A | * | 4/1992 | Schmitz | 219/121.69 |
| 5,446,260 A | * | 8/1995 | Uhling et al. | 219/121.69 |

FOREIGN PATENT DOCUMENTS

| JP | 2-155583 A | * | 6/1990 | 219/121.68 |
| JP | 4-71793 A | * | 3/1992 | 219/121.68 |
| JP | 4-290207 A | * | 10/1992 | |
| JP | 5-135911 A | * | 6/1993 | |

* cited by examiner

Primary Examiner—Geoffrey S. Evans
(74) Attorney, Agent, or Firm—Maine & Asmus

(57) ABSTRACT

In the laser trimming of passive circuit elements such as resistors, capacitors and inductors, various trimming parameters must be selected. To select a element is compared with a target value for the parameter to determine an offset value between the measured parameter value and the target value. The relevant trim parameters are then selected based on the determined offset values.

45 Claims, 21 Drawing Sheets

THIN FILM SUBTRACTIVE PROCESS

THIN FILM ADDITIVE PROCESS

THICK FILM "PASTE" PROCESS

AUTOMATED LASER TRIMMING OF RESISTORS

TECHNICAL FIELD

The present invention relates to trimming elements formed on a panel or other work piece. More particularly the present invention relates to trimming elements, such as resistors, capacitors or other passive circuit elements, which may be later embedded in a layer of a multi-layer work piece, such as a Printed Circuit Board (PCB).

BACKGROUND ART

Material processing is used to adjust the performance of electronic elements by removing or otherwise affecting a portion of the material of the electronic element to change the electrical characteristics thereof. It is known to change the electrical properties of passive and some active electronic elements by removing material therefrom. Methods of removing material include applying laser energy for vaporizing a portion of the material, applying laser energy for ablative removal of the material and applying laser energy to affect a photochemical reaction for removing and/or otherwise altering an electrical performance characteristic of the material. It is well known that the relative effect of these three processes depends on the energy density and wavelength of the laser, and the properties of the material illuminated by the laser.

Lasers are used to perform all of these material-processing techniques. Laser material processing is routinely performed using a position and power controlled laser beam that is directed to scan over a desired region of the material for processing. These techniques are used to process individual passive electronic elements such as resistors, capacitors and inductors, as well as to process electrical elements in microchips, e.g. for memory chip repair and/or for trimming electrical elements formed onto silicon or other crystalline substrates.

In particular, a laser beam is directed over a region of the electrical element to remove or trim material from the element. The trimming may affect the electrical performance of the element by reducing the volume of electrical material in the element or by altering a path of electron flow through the material, e.g. by creating a longer resistive path or even by creating an open circuit by completely removing a conductive path between two elements.

It is well known in the manufacturing of precision electrical resistors to laser trim each resistor to adjust its resistive value to fall within a desired range. It is also known to measure the resistive value during the laser trimming process and to continue to trim the resistor until the resistive value is acceptable.

FIGS. 1A and 1B depict a conventional precision chip resistor manufacturing process wherein a resistor panel 100 comprises a ceramic substrate 110 having a plurality of precision resistor elements 120 formed thereon by a printing, screening, growing or any other resistor forming process. The resistor panel 100 may also include conductive portions formed thereon including conductive leads (not shown) attached to each resistor 120 for providing an electrical connection to the resistor element. Conductive measurement contacts 130 may also be provided for probing the resistor element 120 to measure its resistance value.

FIG. 1B depicts an enlarged resistor element 120 having conductive measurement contacts 130 attached thereto for providing a convenient resistance measuring position for placing measurement probes 140 in electrical contact with the resistor element 120 for measuring its resistance value. A measurement circuit 150 is connected to the probes 140 and applies a measurement voltage across the resistor element 120. It is customary that the probes 140 measure the resistance value during the trimming process.

According to conventional precision chip resistor manufacturing methods, it is desired that each of the resistor elements 120 formed on the ceramic substrate 110 have substantially the same resistance value within a narrow tolerance range. However, each resistor element 120, as applied to or formed onto the ceramic substrate 110 may have a resistance value that falls outside of the desired range due to uncontrollable aspects of forming the resistive elements onto the substrate. Accordingly it is known to trim each resistor using a laser-trimming device to adjust the resistance value, if needed, such that all of the resistor elements have a resistance value that is within the desired range. To trim each resistor element 120, the probes 140 are electrically contacted onto the measurement passive elements 130 and the initial resistance value is measured. A laser beam is then directed onto the resistor element being probed to make a trim cut which cuts through the resistor material to the ceramic substrate. The cut resistor has an increased electrical resistance as compared to the uncut resistor, as the cut reduces the cross-sectional area.

Various resistor trimming cuts are known, including a double plunge cut shown in FIG. 2A and an L cut shown in FIG. 2B. In each of these cuts it is desirable to adjust the resistance value without locally restricting the current flow so much that the region of the resistor around the trim cut is excessively heated by ohmic losses during normal operation of the finished circuit. Accordingly, the cuts are made in a central region of the resistors without cutting more than about half way across the resistor width, W.

Once the trimming is complete, the panel 100 is diced up into sections with one resistive element 120 on each section and the resistive elements are incorporated into electrical circuits usually as surface mounted elements. Accordingly it is known in the prior art to manufacture individual resistors, which are trimmed before being incorporated into an electrical circuit or installed onto a PCB panel. These resistors may be surface mounted onto printed circuit boards (PCB's) such as computer mother boards, cell phone controllers, and the like, or the resistors may be used in transducers, testers, controllers or any other type of electrical device where a pre-measured pre-calibrated resistor may be required.

Similarly, many of the techniques described above are used during the manufacture of precision chip capacitors. In FIG. 2C, a typical capacitor cut is shown wherein a corner of the capacitor is isolated from the remaining element to adjust the area of one of the conductive layers, thereby reducing the capacitance of the element.

One example of a precision chip element laser trimmer currently available is the GSI LUMONICS W770 Chip Element Trim System, manufactured and distributed by the assignee of the present invention.

In another example of the use of laser trimming, it is known to trim individual elements such as resistors, resistor networks, capacitors, inductors and integrated passive elements that are incorporated into a hybrid integrated circuit formed, for example, on a ceramic substrate. As described above, individual elements of the hybrid circuit may be probed to measure an electrical characteristic of the element and laser trimmed to adjust the electrical characteristic as required. The finished tested and trimmed circuits may then be sold for incorporation into another device, e.g. mounted onto a PCB, or the hybrid circuit module itself may comprise a special purpose device such as a sensor.

Examples of hybrid circuit trimming systems currently available for laser trimming resistors include the GSI LUMONICS W670 Thick Film Laser Trim System and W678 Thin Film Laser Trim Systems each manufactured and distributed by the assignee of the present invention.

In other examples of laser trimming, it is known to trim individual elements such as chip resistors, resistor networks and integrated passive elements that are incorporated into an integrated circuit formed, for example, on a silicon substrate or other semiconductor. As described above, individual elements of the circuit may be probed to measure an electrical characteristic of the element and laser trimmed to adjust the electrical characteristic as required. The finished tested and trimmed semiconductor circuits may then be sold for incorporation into another device, e.g. mounted onto a PCB, or the circuit chip itself may comprise a special purpose device such as a transducer.

It is also known to trim elements after an element has been surface mounted onto a PCB or otherwise incorporated into an electrical circuit. In this case, a completed and functional device may be probed to measure an electrical response to an electrical input stimuli and one of the circuit elements of the electrical circuit may be laser trimmed while the circuit is active, to change the circuit performance according to a desired circuit response.

Other electronic elements such as capacitors and inductors have also been trimmed using a laser to remove or otherwise affect a material that can change the capacitance or inductance, respectively, of the element. It is known to trim individual passive elements such as resistors, capacitors and inductors to achieve a desired resistance, capacitance or inductance. It is also known to trim passive elements in a passive network of elements for example to adjust the resistance of a pair of resistors connected in parallel or in series by trimming just one of the resistor elements.

As shown in FIG. 3, historically, pre-manufactured trimmed electronic elements and even trimmed integrated circuits mounted on silicon chips have been installed onto the surface of a prefabricated PCB panel. A section of a finished PCB 160 of the prior art is shown in FIG. 3. Passive electronic elements 170 and 180, such as pre-trimmed resistors, capacitors, inductors or chips, are attached to a PCB panel and interconnected with other circuit elements via conductive layers 190 which provide predetermined conductive paths between surface mounted elements. Each conductive layer is separated by a dielectric layer 200 to electrically isolate the conductive layers.

Passive electronic elements may electrically contact just the top conductive layer 190, as shown for the element 170 (called surface mount components), or a component may be mounted using one or more holes drilled completely through the printed circuit board (called through hole components), possibly connected to several conductive layers 190 depending on the individual circuit design. In this latter case, the element 180 includes conductive leads 210 that are inserted into through-holes 220 drilled or otherwise formed in the PCB blank prior to mounting the element 180. In any case, the elements are attached and electrically contacted to conductive layer(s) by soldering.

Thus according to the prior art, a finished PCB includes one or more conductive layers and one or more dielectric layers. The conductive layers are generally etched or otherwise formed into a pattern of conductive paths that interconnect to form electrical circuits. Conducting via holes are pre-formed through the one or more conductive and dielectric layers to allow a surface mounted element to form an electrical contact with one or more conductive layers. Thereafter, passive or active electronic elements of the circuits such as resistors, capacitors, inductors, chips, transistors, amplifiers, diodes, and the like, are surface mounted onto the PCB blank and soldered to contact one or more of the desired conductive layers. In many cases, the electrical elements are pre-trimmed to provide a specific electrical performance. However, in some cases, a surface mounted element may be trimmed after installation onto the PCB.

According to newly developed procedures for fabricating finished PCB's, some passive elements are being formed directly onto the conductive and or dielectric layers of a PCB panel such as is shown in FIG. 4. FIG. 4 depicts one example of a partially fabricated PCB panel 240 having a dielectric layer 250 and a plurality of conductive paths 260 formed onto the dielectric layer 250 by conventional means.

As shown, the substantially same circuit pattern 270 is repeated six times over the panel such that six separate circuits may be formed on the single panel 240. After completion, including the mounting of any surface mounted elements, the panel 240 may be diced up into six separate PCB's. Alternately, the panel 240 may comprise one large circuit board.

In the present example, a plurality of passive resistors 280 are formed directly onto the panel 240 by printing, painting or otherwise applying a resistive paste or film between selected conductive paths 260 of the circuit 270. Each resistor is in direct contact with the dielectric layer 250 and interconnects at least two isolated conductive paths 260. As an alternative process, a sheet of resistive or insulating material backed with a conductive layer is laminated as a continuous layer on the circuit board, and then the patterns are etched in the conductive/resistive or conductive/insulating structure to form resistors or capacitors. Both the printing and etching techniques for forming embedded passive elements are discussed in greater detail following a discussion of the present limitations of embedding passive elements in printed circuit boards.

All of the passive resistors 280 may be applied simultaneously such as through screen or template or they may be applied in several steps. After application, the resistive paste or liquid is cured by baking or another curing process to provide a finished resistor. In subsequent fabrication steps, one or more dielectric and conductive layers may be applied over the layer including over the cured resistors just applied, as shown in FIG. 4. Moreover, additional resistors may be formed directly onto subsequently formed layers of the PCB blank. In a completed PCB, formed by the process, numerous passive resistors may be formed onto each layer of the PCB such that a large number of resistors are embedded within the PCB panel 240.

A significant benefit of the method of embedding passive elements into the PCB is that each embedded passive element eliminates a corresponding surface mounted passive element thereby providing more space on the surface for mounting other elements, or reducing the overall area of the finished circuit board. In addition, the cost of fabricating embedded resistors is lower than the cost of separately fabricating and then surface mounting surface mount resistors. The above process and benefits also apply to other embedded passive elements such as capacitors and inductors.

Another significant benefit of the method of embedding passive elements into the PCB is that the electrical performance of the associated circuits may be improved. Closer placement of the passive circuit elements to other passive and active circuit elements reduces the path length of the conductive interconnects between elements. Especially for circuits operating at high frequencies, short interconnects reduce the radiated electromagnetic fields and reduce parasitic capacitances and inductances present in the circuit.

Embedded elements are usually placed on layers close to the core material because this part of the panel provides the most stable surface during the build-up or lamination process. The initial placement of these elements occurs in the earlier stages of production of a PCB at which point the elements are on the top surface of the panel. After all of the passive elements are printed and cured, or etched, another layer, e.g. a copper or dielectric layer, is laminated over the layer to embed the passive elements.

A significant problem with the use of embedded passive elements is that the electrical characteristics of the deposited or etched elements are difficult to control and predict because of variables in the fabrication process. For many applications, it has not been possible to fabricate embedded elements with sufficient accuracy due to these limitations.

Accordingly, heretofore, embedded passive elements have been restricted to use in circuit paths that can tolerate a wide variation in resistor or other passive element values and manufacturers have been forced to use surface mounted passive elements whenever a narrow range of electrical performance is required of a particular circuit element. This has limited the use of embedded passive printed circuit boards in many critical performance systems.

The majority of the problems associated with embedding resistors within layers of a PCB panel relate to the typical materials used for the resistor elements, the substrate or mounting material, and any surrounding materials proximate to the resistor such as a dielectric layer laminated or coated on top of the resistor.

Two major groups of materials are currently used for embedded resistor elements in PCB panels. The first material group includes thin film resistors made from different metal-based alloys which are laminated or deposited on the board surface. The thickness of these resistors is usually less than 1 micron. The thickness and composition of the resistive layer determine the sheet resistance of the material. The sheet resistance, or resistivity, of the material is given in units of ohms per square. The thinner the material forming the resistive layer, the higher the sheet resistivity. At present, commercially available thin film resistors have a sheet resistivity within a range of 25 Ohms/square to 250 Ohms/square, although recent reports describe a 5 nm thick material with a sheet resistivity of 1000 Ohms/square (See Shipley Inc., Insite™ resistors, Ref. P. Chinoy, et al., CircuiTree Magazine, March 2002, p 78).

Two principal processes are used in the formation of thin film resistors. The first involves lamination of a continuous copper foil/metal alloy sheet, followed by photo-mask, expose, and etch steps to pattern both the copper and thin film material according to the circuit design. This is a fully subtractive process, since material is removed to form the circuit elements. A typical thin film resistor formed by this subtractive process is shown in FIG. 20A. The continuous copper foil/metal alloy sheet is laminated to a dielectric 2010. After the required etching steps, a thin film resistor 2030 is formed on the surface of the dielectric. Copper pads 2020A and 2020B are in contact with the resistor 2030.

Typical materials utilized for this first type of thin film resistors include Ohmega-Ply sheets from Ohmega Electronics (See Glen Walther, *Tolerance analysis of Ohmega-Ply resistors in multilayer PCB design*, CircuiTree Magazine, March 2001, p 64); Ni/Cr or Ni/Cr/Al/Si alloys from Gould Electronics (See Jiangtao Wang and Sid Clouser, *Thin film embedded resistors,* IPC Printed Circuit EXPO2001. 2001, S08-1-5). Thickness and composition of the resistive layer are typically well controlled in this process.

The second process involves an additive process of selective deposition, typically an electrochemical plating process, to form the resistive elements. As depicted in FIG. 20B, this plating 2040 is performed on the surface of pre-patterned copper on a PCB dielectric substrate or panel 2010 such that it contacts at least two electrically independent copper pads 2020A and 2020B already present at the ends of the resistor according to the circuit design. A typical material utilized for this second type of thin film resistor includes Ni—P electroplated material from MacDermid Inc. (See Joe D'Ambrisi, Dennis Fritz and Dave Sawoska, *Plated embedded resistors for high speed circuit applications*, IPC Annual Meeting, October 2001, S02-1-4). Thickness and composition of the resistive layer are susceptible to variation due to difficulty in control of the process parameters used to deposit the film.

In both processes, but especially in the second, the variation in thickness and composition of the resistive layer determines in most part the variation in sheet resistance of the material. Furthermore, in both processes, the geometry and dimensions of the film pattern between the copper pads, and the distance between the copper pads, determine the actual resistor value in Ohms. Some, but not all, of these variables can be controlled within reasonable tolerance limits during the PCB fabrication process. Thin film resistors deposited on PCB panels in production show variation in their values on the order of +/−10%.

In the second material group, known as thick film resistors, resistors are formed from pastes deposited onto the PCB panel or a separate material layer. These pastes may be carbon or silver-filled epoxy mixtures or may have different compositions with resistive properties. Two basic processes are used. The first involves lamination following a high temperature cure of screen printed paste on a copper foil, and the second involves a low temperature cure of paste printed on the surface of patterned copper on a PCB dielectric substrate or panel. Thick film processes may involve pastes with sheet resistivity from 15 Ohms/square to 100 kOhm/square, with correspondingly wide variation in material composition.

In the first process, and according to processing instructions for DuPont™ materials (See William J. Borland and Saul Ferguson, *Embedded passive elements*, CircuiTree Magazine, March 2001, p. 94–106), thick film resistor paste is screen printed onto copper foil at the proper locations prior to firing in an oven in $N_2$ atmosphere at 900° C. After that the pre-printed copper foil is laminated to the dielectric layer of the board, and the resistors are exposed through selective etching of the copper according to the circuit design.

In the second process, the wet resistor paste for embedded thick film resistors is typically screen-printed on the surface of patterned copper on a PCB dielectric substrate or panel 2010 as depicted in FIG. 20C. Alternately, the paste may be selectively deposited in a bead from a dispenser. In both cases, the paste 2050 is so deposited such that it contacts at least two electrically independent copper pads 2020A and 2020B already present at the ends of the resistor according to the circuit design. Additionally, another conductive interface layer may be present between the resistor paste and the copper pads to improve contact between the paste and the copper. The wet paste is then oven cured for durability and stability. Several polymer thick film (PTF) paste compositions with sheet resistivity from 15 Ohms/square to 100 kOhm/square are offered by Asahi Chemical Co. The printing and curing processes are adjusted for each paste type. The paste is printed at the resistor location directly onto pre-etched conductive tracks. The board, including dielectric core, is then fired in an oven for a relatively short period of time. According to Asahi documentation, the curing temperature varies widely from one material to another, with typical values ranging from 150° C. to 270° C. As a result, if several paste compositions are used to produce the range of resistor values required for any particular layer, several cycles of printing and firing are involved in resistor fabrication. During these cycles, one or more pastes will have more than one curing cycle, making the prediction of final resistance values for these resistors quite complex. Furthermore, the low temperature and short time used for the curing process result in a cured paste that is softer and less temperature stable than its high temperature counterpart.

As for thin film resistors, the final resistance of the as-formed thick film resistor is governed by composition of the cured resistive paste, the dimensions and geometry of the paste in length, width and thickness, and the distance between copper contact pads. FIGS. 20D and 20E depict typical cross sections along the width of a thick-film resistor. FIG. 20D shows a resistor with an even width of the resistive material 2060 and two edge zones 2070 that are short compared to the width, whereas FIG. 20E depicts a thick film resistor 2080 with a thickness profile that has a variation from zero microns at the edge to about 50–60 microns in the centre of the resistor. This profile may result from the screen printing process and melting during curing. The non-uniformity of the thickness profile has implications on the predictability of final value and also affects the laser trimming process.

In production, the as-formed thick film resistor process typically provides a resistor with a distribution of +/−20% from the mean value. Additionally, the mean value may be shifted relative to the target as-printed value. The tolerance of as-formed thin film resistor values is better than that of the thick film resistors because better control of material composition and thickness is possible for the thin film materials and processes.

Thick film resistors, although prone to larger variation due to the effects described above, offer other advantages over thin film resistors including at present a much wider range of material resistivity and lower overall material, process, and implementation cost.

It is evident that in order to bring the as-formed resistor tolerances within +/−1% to +/−5% of the target value, trimming of the resistors, as described above, is required. This may be said for all types of both thin film and thick film devices, and as has been discussed above, the characteristics of each may be quite different. Typically, the trimming operation is performed after the resistors have been deposited and are located on the outside of the panel at that process step before lamination or other processes.

Conventional systems used for trimming chip resistors and hybrid circuits are designed to process substrates or panels up to about 8 inches by 8 inches, depending on the application. In addition, these substrates are typically manufactured of alumina ceramic and are temperature stable, rigid and free from distortion.

There is now a need to perform such trimming on larger substrate sizes, such as 18 by 24, or even 24 by 36 inch panels for embedded passive applications. Furthermore, these substrates will typically be printed circuit boards, that are flexible, affected by changes in temperature and prone to distortion in lamination or other thermal cycling steps.

Automation for handling of the typical smaller alumina substrates that are the usual base for discrete passive elements and hybrid circuits is a well developed area. Machines for trimming these types of components often include handlers that feed individual substrates from a stack into the trimming section of the machine before they are moved out to an unloading area. These machines transport the substrates only, and there is no allowance for significant substrate flexibility or distortion either in handling or automated vision alignment of the parts prior to the trimming process.

Within the printed circuit board industry, typical panel sizes range from 12 inches by 18 inches, to 18 inches by 24 inches to 24 inches by 30 inches. These panels can be very flexible, and because the conductive layers can be fragile, so called slip sheets are often placed between panels when they are stacked. These slip sheets are usually thin sheets of plastic or paper. A variety of automated handling equipment is used to transport circuit boards, and to insert and remove slip sheets during conventional printed circuit board manufacturing. These handlers include combinations of conveyors, and lifting/shuttling equipment, typically using vacuum suction cups to pick up individual PCB panels or slip sheets.

A common PCB panel core substrate dielectric material is a glass or ceramic reinforced or filled epoxy resin. The common name used for this material is FR4, although many specific trade names exist for these materials. The initial copper conductor layers, upon which the embedded resistors may be placed, are located on and/or within this core. During PCB fabrication, the core is subjected to many process steps, many of them involving flexing during handling, cycles of large temperature and pressure swings such as lamination, liquid chemical baths such as etching and plating, etc. The epoxy material is prone to softening and creep at elevated temperatures, resulting in distortion of the panel. The epoxy material is also prone to moisture absorption, changing its thermal and electrical characteristics. In turn, resistors located on this core material are thus susceptible to stresses caused by flexing and dimensional changes in the substrate, thermal cycling, and moisture absorption, among other factors. All of these factors contribute to a possible change in the resistance of the element during the process steps required for PCB panel fabrication.

The laser trimming process, whereby material is melted, vaporized, ablated, or photo-chemically altered may affect the material properties of both the resistor and the core or covering materials, if present. The geometry of the resistive element is also typically substantially changed by the trimming process, which can in turn affect the electrical characteristics and behavior of the resistor during thermal cycles, chemical baths, and other processes. It is known both for resistors conventionally formed during chip resistor or hybrid circuit manufacture, and resistors formed on PCB substrates, that the overall stability of a resistor is affected by the trimming process. For the case of resistors formed on the surface of PCB panels, it has been found that short and long term drifts occur during and after laser trimming, and depend on the paste type used as the resistor material. Factors affecting the drift in resistance value after trimming include, but are not limited to: the paste material; the curing cycle parameters; the resistor size, thickness, and geometry; and the form and structure, or morphology, of the resistor surface. Each of these factors can also affect resistance value drifts during other steps of panel production.

Similar to the core materials, the outer layer laminate dielectric materials are typically composed of a polymer resin which is coated or laminated over the core. This layer may then also be proximate to and in contact with embedded resistors, resulting in further modification of the electrical, mechanical, and other properties of the resistors.

Factors that are known to contribute to resistance changes due to lamination include, but are not limited to: duration of heat applied to the panel during lamination or other steps; resistor properties changes due to heating; substrate properties changes due to heating; stresses in resistor and/or substrate that are released due to pressure/heat applied during different steps of lamination; and chemical reactions in the paste material as well as in the substrate material or both, or with interlayer, if present.

In general, resistors made of high-resistivity paste show larger drifts and thermal effects compared to low-resistivity pastes. This is at least partially due to low thermal conductivity of the high-resistivity pastes because of the lower concentration of conductive material (carbon, for example).

Therefore, through all of the process steps involved in the fabrication of a finished PCB panel, there results a change, or drift, in the resistor value. It is known that the drift of resistance values for embedded resistors in PCB panels is larger in magnitude and less predictable than the drift that is conventionally associated with chip resistor or hybrid circuit manufacture, due to many factors including those described above. It is also now a requirement, however, that the tolerance of the resistance value of an embedded resistor with respect to its nominal target value is as tight as that for chip resistors used today, according to the requirements of the circuit.

The average or mean of absolute resistance values and the spread of these values about the mean are typically regarded as statistical quantities that are used to quantify the control possible over the resistor forming process, as well as the effects of the various drift mechanisms discussed above. The spread of values may be characterized by the standard deviation of a gaussian distribution function fit to the data, where the term sigma or $\sigma$ refers to one standard deviation. It is known from the art of laser trimming chip resistors that the wide $3\sigma$ distribution of $+/-10\%$ to $+/-20\%$ of the as-formed resistor values can be brought down to better than $+/-1\%$.

Since typical laser trimming removes material and thus the resistance of an element can only be increased, the upper limit of the distribution of the pre-trimmed values should lie below the target value to achieve good yield within the target distribution (e.g. $+/-1\%$) after trimming. The effects described previously that contribute to drift also contribute to drift of the resistance values after trimming, since subsequent processes such as lamination may occur. In this case both the final mean and standard distribution of the resistor values may differ from those immediately after trimming. From the descriptions above, it may also be seen that the drift effects on this distribution may be different for different resistor target values, for different resistor sizes and geometries, for different resistor and surrounding materials within a PCB, and for different process parameters used during the PCB panel fabrication.

As has been described above, there may exist several contributors to drift subsequent to trimming and up to final completion of the PCB panel, some not previously known in conventional chip resistor and hybrid circuit manufacture, and these effects may not be consistent for all resistive circuit elements associated with a PCB panel. The ability, then, to achieve narrow final resistor tolerances is thus not assured, compared to conventional chip resistor and hybrid circuit manufacture.

Accordingly, a need exists for an improved technique for trimming of resistors, or other passive circuit elements, embedded within a relatively large multi-layer PCB panel.

OBJECTIVES OF THE INVENTION

Accordingly, it is an object of the present invention to provide a system and method for trimming passive elements formed directly onto PCB panels.

It is another object of the invention to provide a system and method for trimming a variety of different types of passive elements formed directly onto PCB panels and further to provide a system and method for trimming passive element with a wide range of electrical parameter values.

It is yet another object of the invention to provide a system and method for trimming passive elements formed onto PCB panels that trims the passive elements to a parameter value that accounts for parameter value changes that occur subsequent to the trimming operation.

It is yet another object of the present invention to provide a system and method for selecting a trimming process in accordance with a parameter value of the untrimmed element and a target parameter value of the trimmed element.

It is still another object of the present invention to provide a system and method for trimming passive elements formed onto PCB panels that provides a high throughput of trimmed PCB panels.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

SUMMARY OF THE INVENTION

In accordance with the invention, a parameter, such as a cut type or speed, for use in trimming elements—for example trimmed or untrimmed passive circuit elements such as resistors, capacitors and inductors—is selected by first measuring a value of a parameter of each of a plurality of elements. The measured parameter value could, for example, be the resistance or impedance of a resistor. The measurement is preferably taken using one or more probes. The measured parameter value of each element is compared with a target value for the parameter to determine an offset value between the measured parameter value and the target value. The trim parameter is then selected based on the determined offset values. The comparison and selection could, for example, be performed by a processor included in a system controller or other system component. If desired, the measured parameter values, target value, offset values and/or trim parameter can be stored in a system memory, e.g. a random access, hard or floppy disk or other type memory device within the system controller or other some other system component.

Typically, a laser beam is emitted to trim an element in accordance with the selected parameter. In one embodiment of the invention, selection of the cut speed as the trim parameter includes selecting a bite size of the cut and/or a repetition rate at which the laser beam is emitted. If the bite size is selected, the laser pulse energy or spot size of the emitted laser beam could, for example, be adjusted to correspond to the selected bite size.

According to other aspects of the invention, another parameter of each of the plurality of elements, such as the paste type from which an element is formed and/or a geometric parameter, such as the length of an element, is identified. An input device can be used to enter the paste type and/or a geometric parameter such as the length of the element. A user input device, such as a keyboard or mouse or previously stored database, may be utilized to enter the paste type or an indicator thereof. A camera, such as a video camera, could be used to generate image data representing the element and hence the geometric parameters. A system processor could for example, store the entered information in a system memory prior to processing. If such other parameters are entered, they can also or alternatively be used in selecting the trim parameters for each element.

For example, a relationship between a position of an element and a position of an adjacent conductor might first be determined. Based on the determined relationship, a start point distanced from the one element and a direction of movement from the start point may also be determined. A laser beam, such as one emitted from an emitter including galvos and/or other components for directing the emitted laser beam along a desired path, is then moved along a path from the determined start point in the determined direction to an impinge point on the applicable element. From the impinge point the beam is moved to trim the element in accordance with the selected trim parameters.

In accordance with still other aspects of the invention, a first threshold laser beam intensity at which a laser beam impinging on a substrate on which the plurality of elements are disposed will damage the substrate and a second threshold laser beam intensity at which the laser beam impinging on an element will cause ablation are identified. These thresholds could, for example, be entered by the user or computed by a system process. In any event, the laser beam, having an intensity within a range defined by the first and the second thresholds, is then emitted to trim the element in accordance with the selected trim parameter. A system processor could, for example, determine the appropriate intensity. The wavelength of the emitted laser beam may additionally or alternatively be selected, e.g. by a system processor, based on its interaction with the identified type of substrate. In one example, the wavelength is advantageously chosen such that the emitted laser beam does not substantially damage the substrate at the intensity used for trimming at the selected wavelength. In a particularly preferred embodiment of the invention, a laser emitter, which has a wavelength of approximately 1 micron is utilized. However, depending upon the implementation, emitters having substantially higher or lower wavelengths may beneficially be used.

According to yet other aspects of the invention, a desired target distribution of offset values after the trimming of the plurality of elements is identified. In this case, the trim parameters based also on the identified target distribution are selected. It should be understood that the trim parameters for each element could, additionally or alternatively, be selected based on the offset value determined by comparing the measured parameter value of that element with the target value.

Advantageously, a minimum cross-sectional area of an element after actual or anticipated trimming can be determined based on a required operational current for the element and the trim parameters for the element selected to achieve at least the determined minimum trimmed cross-section.

If the measured elements are trimmed elements, the measured values can be used to predict the final parameter value of a yet to be trimmed element. In such a case, a laser beam is subsequently emitted to trim untrimmed elements in accordance with trim parameters selected based on the measurement of the previously trimmed elements.

In a particularly advantageous embodiment for measuring and trimming resistors, a laser beam is emitted to trim the untrimmed resistors in accordance with the trim parameters selected by pre-trim measurement of these resistors. The change in the measured parameter value of each of the resistor elements is measured during the trimming of that resistor. A further measurement may, if desired, be made after completion of the trimming. Assuming, that the measured change, and post-trimming measurement if applicable, are satisfactory, the laser beam is again emitted to trim other untrimmed resistors in accordance with the trim parameters selected based on measuring the first resistors prior to trimming, without measuring a change in the value of the parameter during trimming of the other untrimmed resistors, or a value of the parameter of the other resistors after trimming. Furthermore, these other resistors may be trimmed without even measuring a value of the parameter of the other untrimmed resistors prior to trimming.

However, if a value of the parameter of the other untrimmed resistors is measured prior to trimming, beneficially the measured parameter value of each of the other untrimmed resistors elements is compared with the target value to determine another offset value between the measured parameter value of each of the other untrimmed resistors elements and the target value, and other trim parameters may be selected based on the determined other offset values. The laser beam is next emitted to trim the other untrimmed resistors in accordance with the other selected trim parameter, but without measuring a change in the value of the parameter during trimming of the other resistors or a value of the parameter of the other resistors after trimming.

A particularly beneficial sequence of operations in certain implementations, includes trimming elements trimmed in accordance with the trim parameters selected in the manner discussed above to change the offset value determined by comparing the measured parameter value of that element with the target value. A value of the parameter of each of the first trimmed elements is measured again and this measured parameter value of each element is compared with the target value to determine another offset value between the again measured parameter value and the target value. If the other offset values are determined to be within a predefined range, no further trimming is performed. However, if the other offset values are determined to be outside the predefined range, other trim parameters are selected based on the later determined other offset values. Each of the elements is further trimmed in accordance with the other selected trim parameter to change the offset value determined by comparing the again measured parameter value of that element with the target value.

BEST MODE FOR CARRYING OUT THE INVENTION

Trimming System Overview

Figure 4:
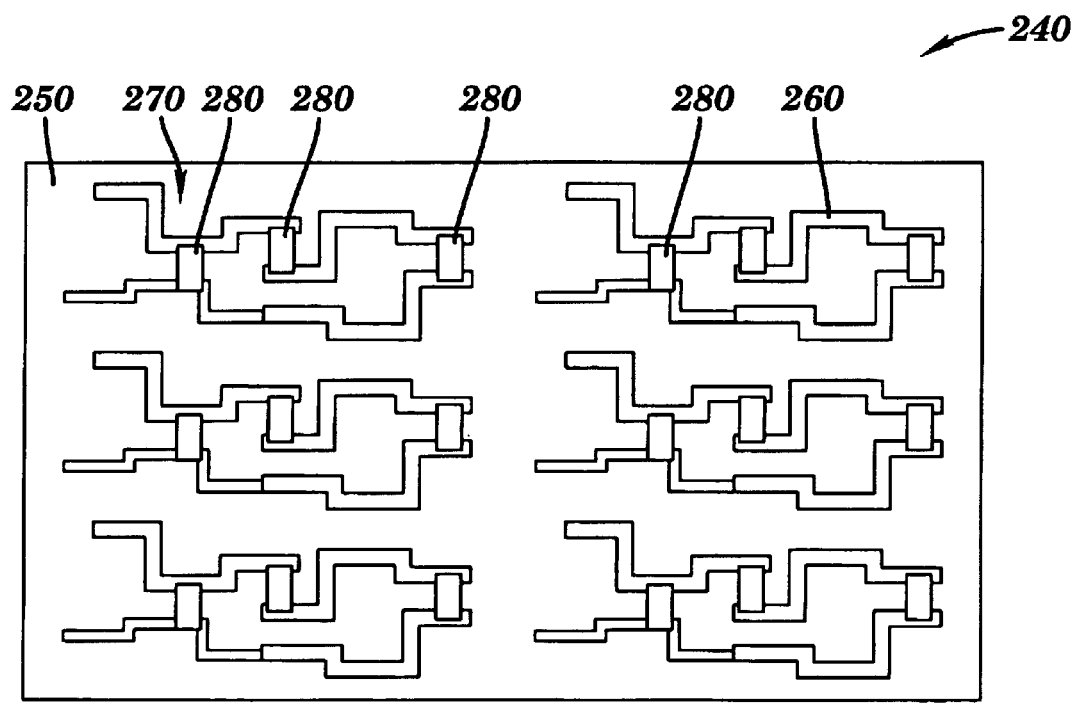
FIG. 4 depicts untrimmed passive resistor elements conventionally formed on a circuit board panel.
Figure 5:
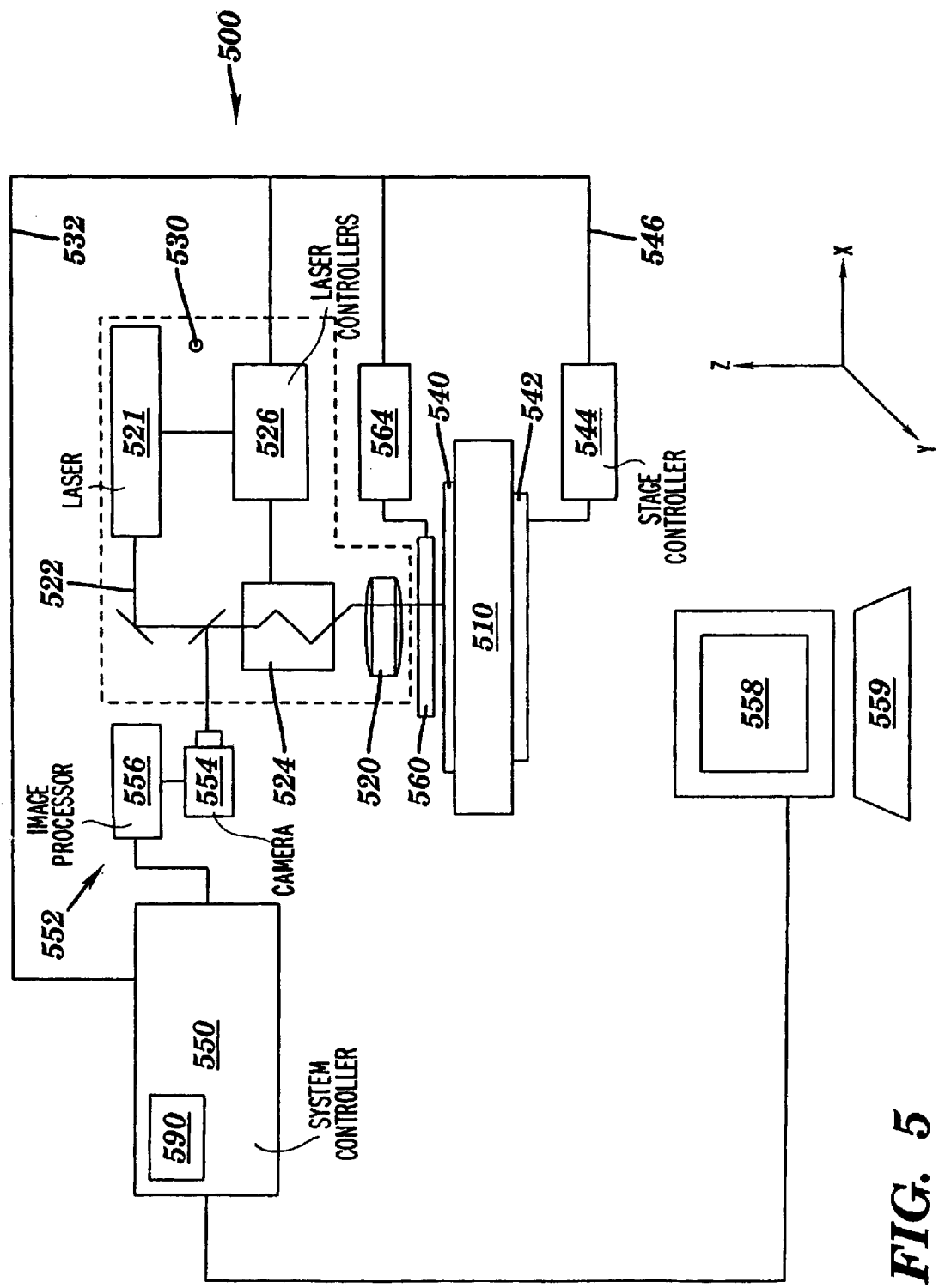
FIG. 5 depicts a schematic diagram of a system for trimming untrimmed passive circuit elements formed onto a PCB panel or workpiece.

FIG. 5 depicts a system 500 for trimming untrimmed circuit elements formed onto a PCB panel, similar to those depicted in FIG. 4, or onto any panel or work piece. A panel or work piece herein refers to a substrate for forming finished circuit boards therefrom and includes at least one dielectric layer or substrate, at least one conductive layer or substrate and at least one untrimmed circuit element formed thereon. In general the dielectric layer may be formed from an epoxy resin having fiberglass filler or other know dielectric substrates used in PCB fabrication. One example of a dielectric layer is the material FR4 available from several suppliers. The conductive layer may comprise a copper layer that is laminated or otherwise deposited contiguous with the dielectric layer. Typically, the dielectric layer has a thickness in the range of about 0.25–1.5 mm and the conductive layer is thinner, usually in the range of 0.1 $\mu$m to 50 $\mu$m thick. The untrimmed circuit element may comprise at least one resistor, capacitor or inductor formed contiguous with one of the dielectric or conductive layers or both. The untrimmed element may also comprise a portion of the dielectric layer or a portion of the conductive layer, or both, as is the case for an untrimmed embedded capacitor.

A panel includes at least one conductive path formed by the conductive layer thereof and the conductive path may form a portion of an electronic circuit to be fabricated in a finished circuit board fabricated from the PCB panel. The conductive path may comprise portions of a plurality of conductive layers formed onto a single panel, such as in a multi-layer PCB. A panel may be used as a substrate for forming a plurality of substantially identical circuits, formed in a repeated pattern on the panel as shown in FIG. 4, or a panel may be used as a substrate for forming a single circuit e.g. a computer mother board, or a panel may be used as a substrate for forming a plurality of different circuits formed in a pattern thereon. A panel size may be the same size as the finished circuit board fabricated therefrom or a panel may be subsequently diced up to form a plurality of smaller sized finished circuit boards. Although panels may be fabricated and trimmed in any size, it is desirable and customary to form panels in a rectangular or square shape having dimensions of from about 10×15 square inches (254×381 mm$^2$) up to about 28×36 square inches, (711×914 mm$^2$).

Laser Subsystem

As shown in FIG. 5, the trimming system 500 includes a laser subsystem 530, outlined in phantom, for directing a laser beam 522 onto a surface of a panel 540 for trimming an untrimmed element formed thereon. The laser subsystem 530 includes a laser 521 and a beam-directing device 524 capable of directing the laser beam 522 over a selected region of the panel 540. The laser subsystem 530 also includes a lens 520 positioned in the path of the laser beam 522, between the laser 521 and the panel 540, for focusing the laser beam 522 to a desired spot size at the surface to be trimmed. The field of the lens 520 may range from about 1.0 inch in diameter up to about 8 inches in diameter but a field of view that allows the laser beam 522 to be directed over about a 2 inch×2 inch to a 4 inch×4 inch region of the panel 540 is preferred in the present embodiment. Accordingly, the field of view of the laser subsystem 530 is defined by an aperture of the lens 520 and allows a focused beam to address any selected position within the field of view of the lens for processing untrimmed elements within a region of the panel that is positioned in the lens field of view.

The laser subsystem 530 may also include one or more laser subsystem controllers 526 for controlling the position, velocity and power output of the focused laser beam 522 during trimming and during periods when the laser is not trimming. In general, the lens field of view is considerably smaller than the panel size such that all of the elements within the lens field of view are trimmed without moving the panel 540 and then the panel 540 is moved with respect to the lens field of view to position an untrimmed portion of the panel 540 in the lens field of view for trimming. Preferably, the lens 520 is configured as a telecentric lens and the beam-deflecting device 524 is positioned substantially at a focal plane of the lens 520 so that the laser beam 522 impinges substantially normal or perpendicular to the surface to be trimmed over the entire field of view of the lens.

Accordingly, the laser subsystem 530 emits a trimming beam that is focused substantially at a surface of an untrimmed circuit element disposed onto the panel 540 and has sufficient power to precisely remove or otherwise process the material of the untrimmed circuit element in a controlled manner. The position of the laser beam 522 emitted by the laser subsystem 530 can be changed to impinge on untrimmed elements anywhere within the field of view of the lens 520. The motion and modulation of the laser beam 522 is controlled by laser subsystem control signals issued by the laser subsystem controller 526 and the desired positions and motion characteristics of the laser are provided by signals received from a system controller 550 over a connection 532. The system controller 550 controls the operation of the entire trimming system. The system controller 550 includes at least one processor and memory. The system 500 also includes at least one memory 590 for storing programming and other data. Memory 590, as well as other memories described herein, can be any commonly available type memory, including, but not limited to, floppy disk, hard disk, and optical disk. As shown in FIG. 5, memory 590 is separate from the system controller 550, though as discussed below, it could be a part of controller 550.

The controllable laser subsystem 530 may be of any type, but preferably includes a laser 521 that emits an energy beam at a wavelength that is compatible with the type of trimming or laser processing being performed. For example, if a dielectric material is primarily being trimmed, a CO2 laser emitting at a wavelength of approximately 10 um may be most suitable and if a conductive layer is being trimmed, a solid state laser emitting at a wavelength in the range of approximately 9–11 $\mu$m may be most suitable, and if a conductive layer is being trimmed, a solid state laser emitting at a wavelength of approximately 1.06 $\mu$m may be the best selection, and if the trimming is a photochemical process the laser wavelength may be visible or ultraviolet light such as approximately 533 nm and shorter. Selection of wavelength will be further discussed below.

The beam-directing device 524 may comprise any scanning device for scanning a laser beam over a two dimensional region. In the present example, a pair of orthogonally mounted galvanometer mirror scanners, not shown, is provided between the laser 521 and the lens 520. Each galvanometer mirror scanner includes an angular position transducer for tracking the angular position of the mirrors and a servo driver for controlling the angular rotation of each deflecting mirror for directing the laser beam 522 to a desired position. In the present example, the laser subsystem controller 526 includes all driving controls for the laser and the beam deflector. However, these controls may be incorporated into the system controller 550 or further separated into additional controllers.

Panel Motion

The trimming system 500 also includes an X-Y stage 542, upon which is mounted a panel fixture 510 which supports the panel 540, sometimes referred to as the work piece, on which untrimmed circuit elements, similar to those shown in FIG. 4, have been deposited on the panel 540 by any material deposition means. The panel fixture 510 is movable by the X-Y stage 542 in the X and Y directions, in accordance with stage control signals issued by a stage controller 544, in communication with the system controller 550 over the link 546. Stage controller 544 includes a processor and memory. The stage 510 could be of the type controlled by a stepper or linear motor drive, or a ballscrew, belt or band drive system driven by a rotary motor, or by other known drive means, and provides very precise X-Y positioning of the panel 540 with respect to a reference position which may be the center of the field of view of the lens 520. By moving the panel fixture 510, different areas of the panel 540 can be positioned within the field of view of the lens 520. Alternatively, the panel fixture 510 may be held in a stationary position during trimming. In this case, the entire laser subsystem 530 may be mounted onto an X-Y stage as described above. In this case, the laser subsystem 530 can be positioned over different portions of the panel 510 to place the lens field of view over a region to be trimmed.

Vision System

In order to view the panel 540, a computer vision system, generally referred to by reference numeral 552, is provided. The vision system 552 comprises a video camera 554, and a video frame buffer and video image processing electronics, 556, which may be incorporated within, or in communication with, the system controller 550. The vision system 552 is positioned to view the panel 540 through the lens 520 such that the video camera 554 captures images within the lens field of view. The images, which may be captured at rates of about 30 frames per second to continuously up date the image in the field of view, may be displayed on a video display device 558 for viewing by an operator, or the images may be captured, stored and analyzed by the video image processing electronics 556 or the electronic controller 550. The vision system may be used to measure or otherwise determine a location of an element in the camera field of view and in combination with the system controller 550 can be used to determine a location of any element or feature on the panel 540 according to known algorithms.

The vision system 552 may be used to select and or inspect circuit elements on the panel 540 or to capture images of one or more alignment targets or fiducials, e.g. on the panel 540 or on the X-Y Stage 510 to provide information about the position of the panel 540. Images of the targets may be used to determine a position or angular orientation of the panel 540 with respect to a system reference position or orientation. In addition, video images of other alignment targets and or circuit elements may be used to determine a position of an object within the lens field of view and to direct the laser beam 522 in accordance with the position of an object as determined by the vision system 552. The vision system 552 may also be used to detect if the correct PCB panel has been loaded onto panel fixture 510, if the untrimmed elements appear to be properly applied onto the panel 540 and if trimmed elements meet predefined trim criteria such as whether the trim cut is properly positioned with respect to any edges or other features of the circuit element being trimmed. In addition, the vision system 522 may be used to determine a position or condition of a measurement probe, which is described below. Accordingly, an error condition detected by the vision system 522 may be communicated to the system controller 550 where a logical decision can be made to either correct the error or to take some other automatic action in response to the error condition, including stopping the trim operation. The system 500 also includes one or more operator input devices such as a keyboard 559, mouse or control panel.

Probing and Measuring

Figure 6:
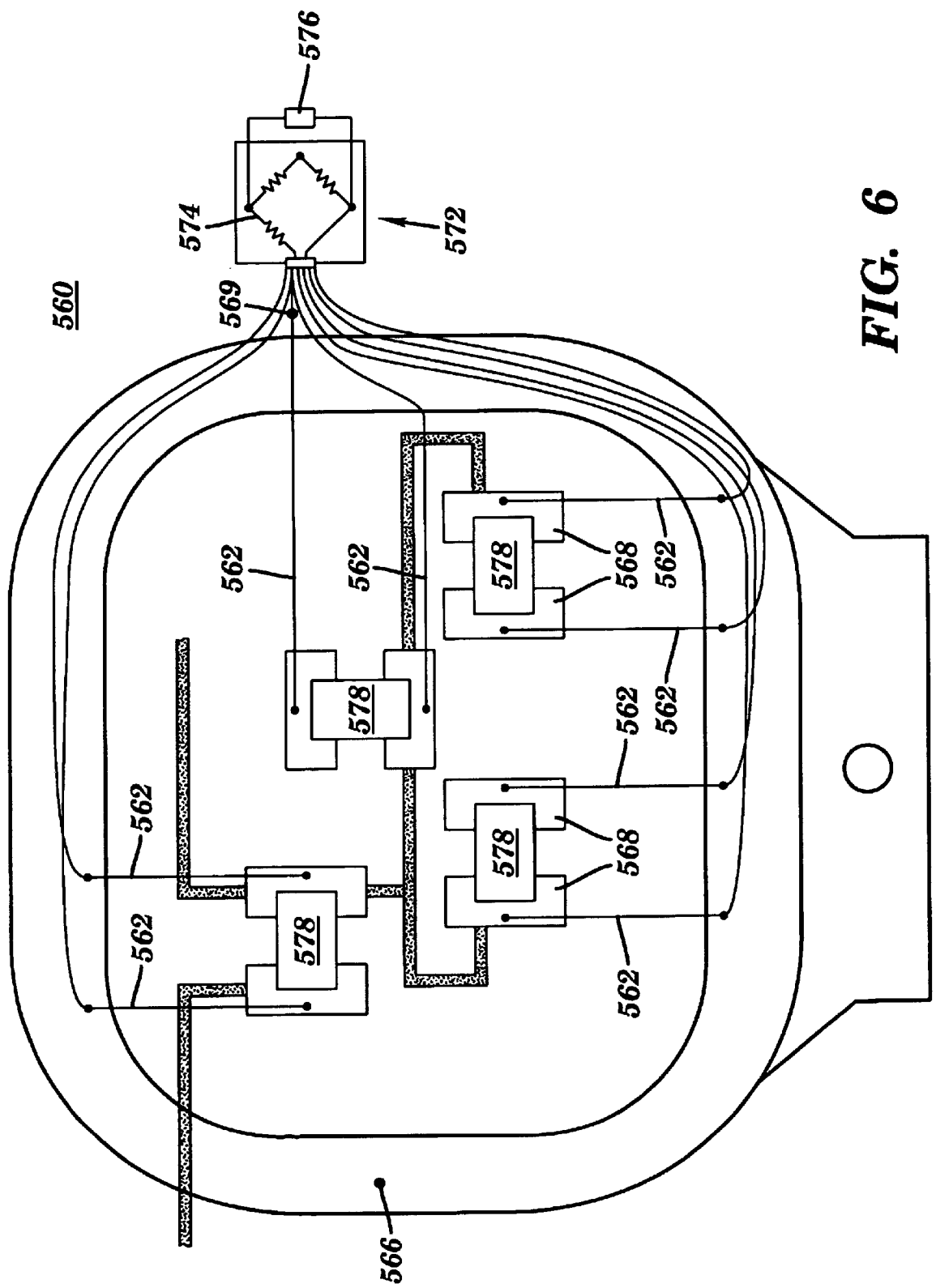
FIG. 6 depicts a probe card and probe measurement circuit according to the invention.

To perform the necessary trimming of the untrimmed circuit elements, formed on the work piece during the fabrication process, the controller 550 issues control signals to the X-Y stage controller 544 directing the X-Y stage 542 to first position one or more circuits located on the panel 540 within the field of view of the lens 520. The trimming system 500 may also include, but does not require in all applications, an electrical measurement subsystem that can be used to probe the circuits before, and/or during, and/or after trimming. A probe card 560, shown in detail in FIG. 6, is one of several types of probing modules that may be connected to the measurement system. Other probing options include flying probe assemblies, non-contact capacitive or inductive probes, or other known electrical probing techniques. In the case of use of a probe card, the probe card 560 is positioned over the portion of the panel 540 to be trimmed and includes probes 562 for measuring circuit elements during trimming and provides a clear path for the laser beam 522 to trim the circuit elements in the field of view of the lens 520. The probe card 560 is supported for vertical movement parallel to the Z-axis shown in FIG. 5. The probe card 560 further includes a probe controller 564, which is in communication with the system controller 550. Probe controller 564 includes a processor and memory. Prior to trimming elements, the controller 550 sends control signals to the probe controller 564 to lower the measurement probes 562 onto the panel 540 thereby placing the measurement probes 562 into contact with measurement points for measuring an electrical characteristic of one or more circuit elements. Measured values can be stored in memory 590, or in one or more other memories. The probe card 560 is lifted away from the panel 540 during period of no measurement.

As shown in FIG. 6, the probe card 560 includes multiple sets of circuit element measurement probes 562 which may comprise flexible conductive elements supported by a probe support ring 566 and cantilevered from the probe support ring 566 to a position over a set of circuit element measurement pads 568 of a circuit element to be measured. The probe set may include one or more probes. Each set of probes 562 includes probe wire leads 569 leading out of the support ring 566 to a measurement circuit 572. The measurement circuit 572 may comprise a resistor bridge 574 and a voltage source 576, or other measurement circuit specific to the requirements of the pertinent electrical characteristics of the circuit being measured. Each set of probe leads 569 are switchably connected to the measurement circuit 572 such that each untrimmed or trimmed circuit element 578 can be addressed and measured as long as the measurement probes are in contact with the measurement pads thereof.

The measurement circuit 572 provides and output signal for each measured electrical characteristic of the circuit element being measured and sends the output signal to the probe controller 564 or to the system controller 550. Alternately, all of the probe leads 556 may be simultaneously connected with the measurement circuit 572. In general, each element to be trimmed that is within the field of view of the lens 520 will have a measurement probe set 562 associated therewith. All of the probe sets are simultaneously lowered into contact with the measurement pads 568, or a designated measurement area for measuring the circuit element 578. In the case of probes designed for mechanical contact, the probes may be forced into contact with the measurement pads 568 to obtain an acceptable electrical contact for measuring an electrical characteristic of the element 578.

Operational Parameters

The system 500, described above and shown in FIG. 5, operates in the context of several parameters, including parameters associated with the laser subsystem 530, parameters associated with the measurement of the passive elements, and parameters associated with the manufacture of the passive elements themselves.

Figure 7:
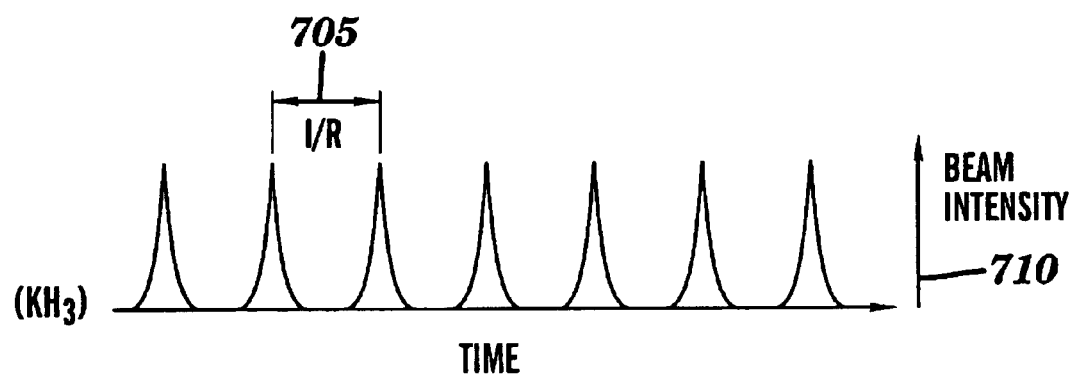
FIG. 7 depicts a repetition rate for a laser.

Parameters associated with the Laser subsystem 530 include a repetition rate of the laser 521. The repetition rate (R) defines a series of laser beam 522 pulses emanating from the laser 521 for a given unit of time. As shown in FIG. 7, a frequency of the pulses is defined as 1/R 705 and is expressed in kilohertz (kHz). Conventionally, the repetition rate is constant for any given trim processing operation. Selection of repetition rate will be further described below.

Another parameter associated with the laser subsystem 530 is pulse energy (E). Pulse energy is defined as the energy of a single laser beam pulse. As shown in FIG. 7, conventionally pulse energy 710 is constant for any given trim processing sub-operation. Selection and variance of pulse energy will be further discussed below.

Yet another parameter associated with the laser subsystem 530 is the diameter (D) at the work piece 540 of the laser beam 522 after passing through the scan lens 520. The beam diameter at the work piece is also known as spot size. This diameter is defined by the separation of the $1/e^2$ intensity points (e is Euler's constant, approximately 2.178). Conventionally, the diameter is held constant during any given trim processing operation, though diameters can be caused to vary among different trim processing operations.

Figure 8:
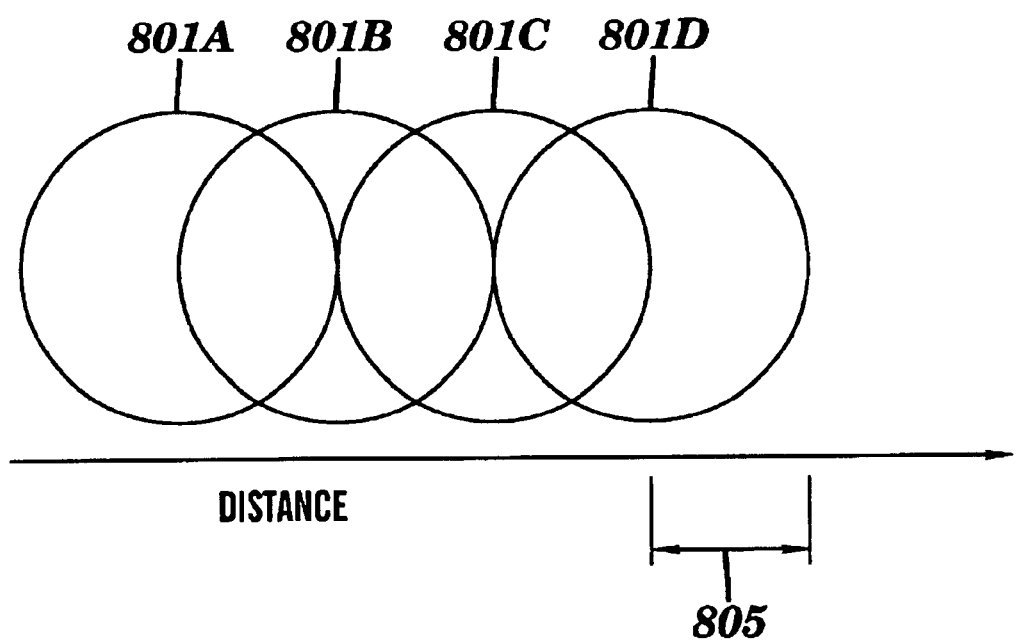
FIG. 8 depicts a bite size for a laser.

Bite size is also a parameter associated with the laser subsystem 530. Bite size is an amount that the laser beam 522 is advanced on the work piece between pulses of the laser 521. The amount of movement of the laser beam 522 is typically on the order of microns ($\mu$m). FIG. 8 shows a series of dots 801A–801D, each representing a position of the laser beam 522 on a work piece. As shown, each dot is spaced a given amount from a dot immediately adjacent to that dot. This space is the bite size 805. Conventionally, the bite size is not varied for a given trim processing sub-operation. Selection of bite size will be further discussed below.

Still another parameter associated with the laser subsystem 530 is wavelength of the laser beam 522. Typically, a laser subsystem has a single laser having a given wavelength. Wavelength selection will be further discussed below.

Figure 9A:
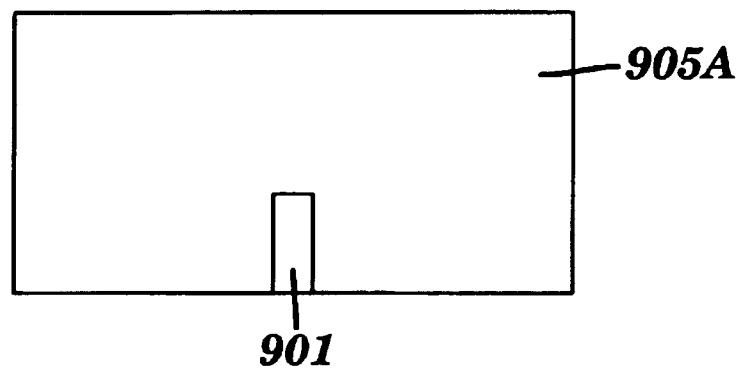
FIG. 9A depicts a conventional single plunge laser-trimming cut.
Figure 9B:
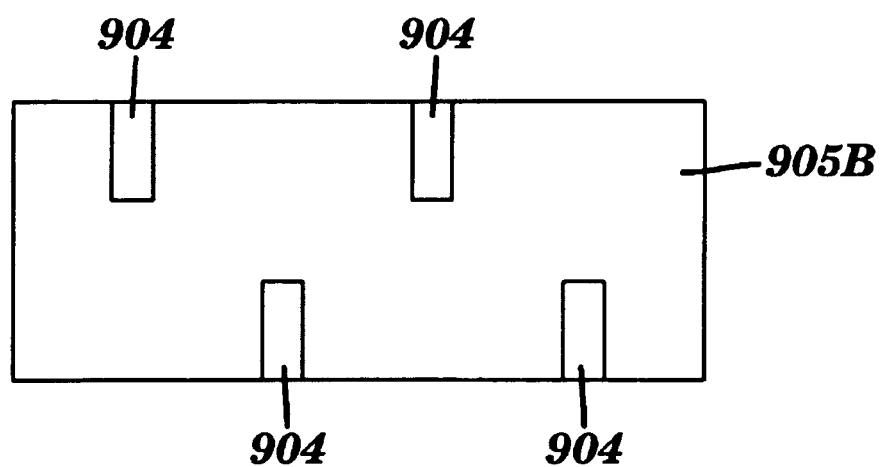
FIG. 9B depicts a conventional serpentine laser-trimming cut.

Yet still another parameter associated with the laser subsystem 530 is cut type, introduced above. FIGS. 9A and 9B represent two more typical cut types.

FIG. 9A depicts a single plunge cut 901. In a single plunge cut the laser beam 522 is directed to cut into a passive element 905A, such as a resistor, capacitor, or inductor, a given distance to achieve some desired property of the element. This particular cut does not give good accuracy for several reasons. One reason, which relates to resistance of resistors, is that the rate of change of resistance resulting from each bite of the single plunge cut changes as the cut progresses across a resistor, making precise control of resistance difficult.

Figure 1B:
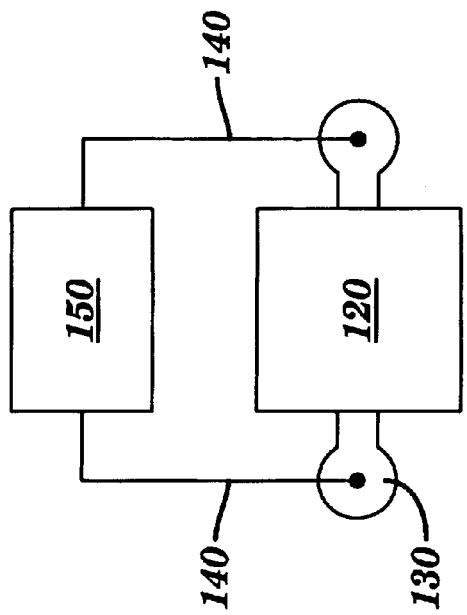
FIG. 1B depicts a single untrimmed resistor element including measurement pads and a resistance-measuring device for measuring the untrimmed resistance.
Figure 1A:
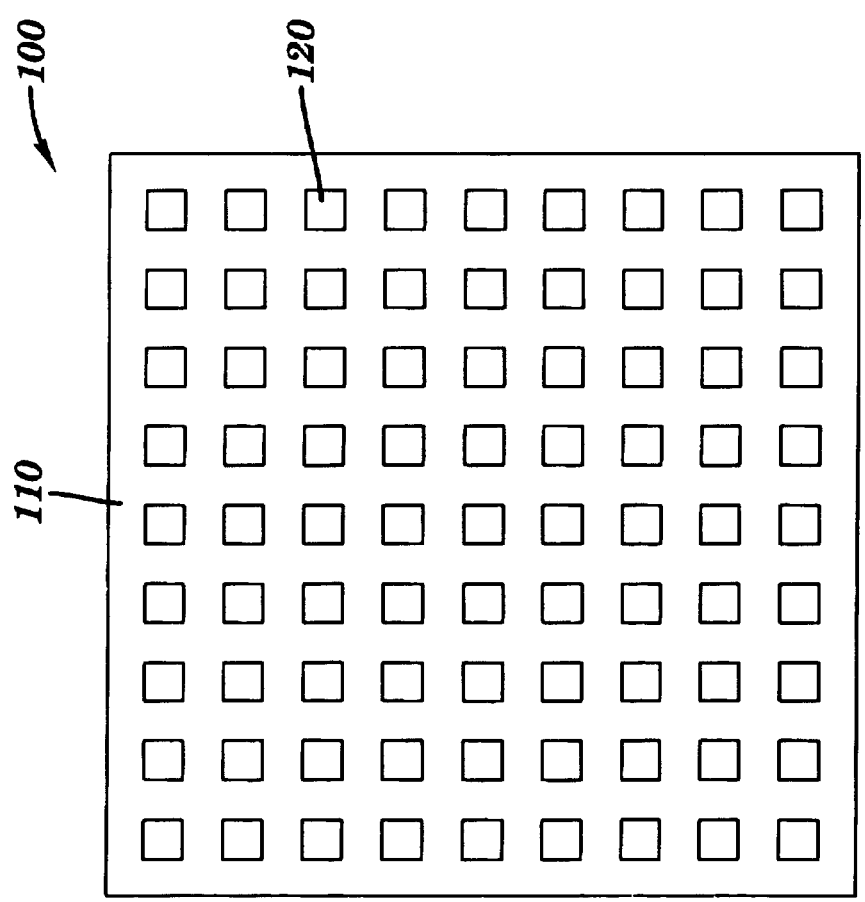
FIG. 1A depicts a resistor panel having ceramic substrate having untrimmed resistor elements formed thereon for trimming by a conventional laser-trimming device.
Figure 2A:
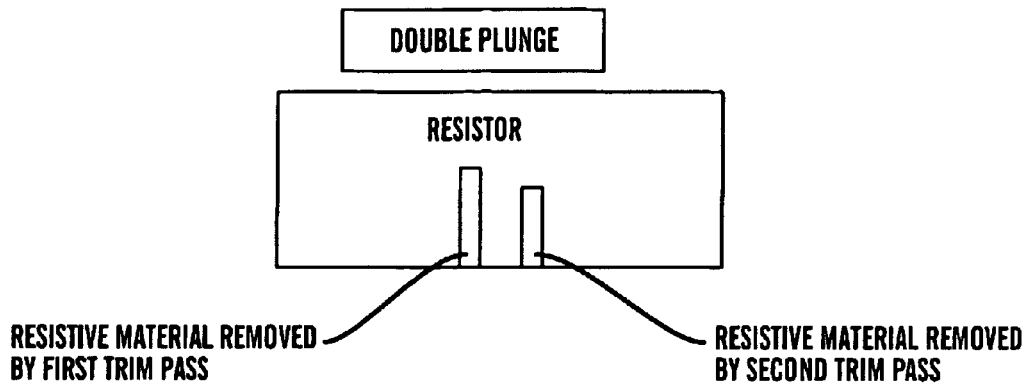
FIG. 2A depicts a conventional double plunge laser-trimming cut.
Figure 2B:
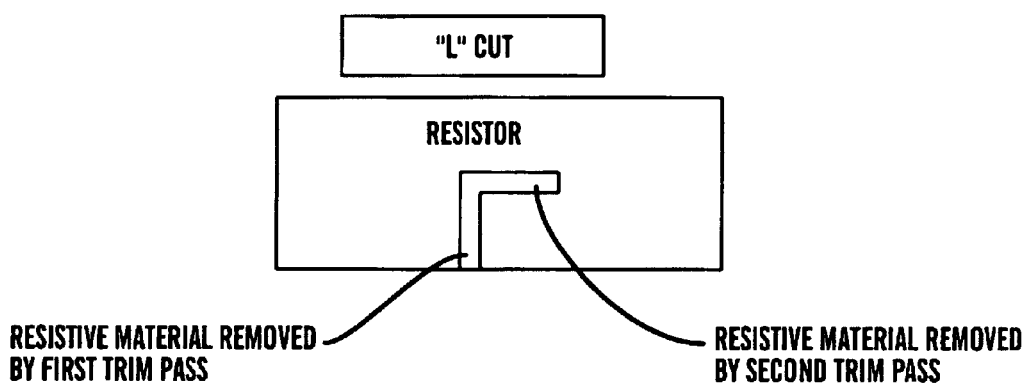
FIG. 2B depicts a conventional "L" cut laser trimming cut.
Figure 2C:
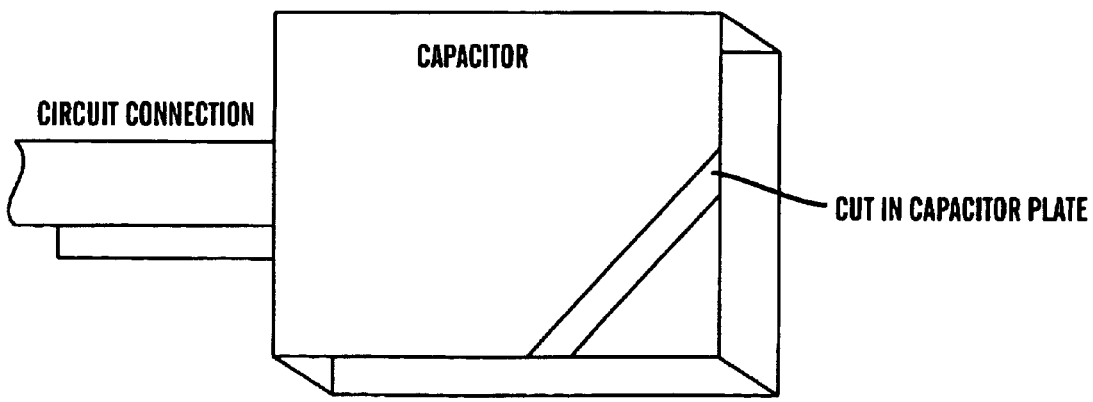
FIG. 2C depicts a conventional laser-trimming cut in a capacitor plate.
Figure 3:
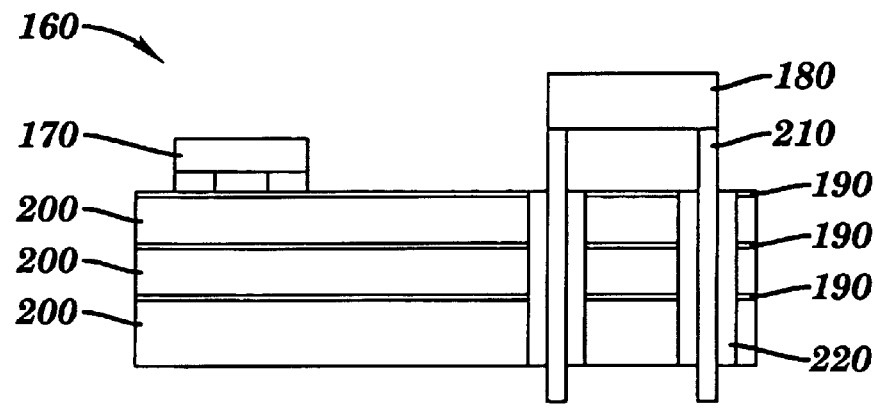
FIG. 3 depicts a conventional PCB having surface mounted electronic components mounted thereon.

Double plunge cuts, as depicted in FIG. 2A, are an improvement over the single plunge cut of FIG. 9B. For a double plunge cut, the laser beam 522 is directed to cut into a passive element a given distance to achieve some threshold value of a desired property, such as resistance or capacitance. The laser beam 522 is then directed to make a second cut into the passive element. For the case of a resistor, this second cut has a reduced sensitivity, because the current path through the resistor has already been restricted by the first cut, resulting in better precision in achieving the desired property.

FIG. 9B depicts a serpentine cut 904 in a passive element 905B. Serpentine cuts are useful when a property, such as resistance, of an as-formed passive element varies greatly from a target value of the property. As with double plunge cuts, the final cut will be the most precise cut. The multiple cuts which are a part of a serpentine cut result in a greatly increased length that current must travel through a passive element. Selection of cut type will be discussed further below.

Parameters associated with the measurement of passive elements include the current and/or voltage used to measure a passive element before, during, and/or after a trimming operation. When low voltages and/or currents are used in measuring a passive element, the resultant measurement is often polluted with noise, which results in a less precise measurement. When higher voltages and/or currents are used in measuring a passive element, noise pollution is lessened. However, high voltage and/or current can affect desired properties of the passive element. For example, high current may affect the resistance of a resistor due to heat generated by the high current. And, high voltage may short a capacitor. Heating affects are more severe for embedded devices because of several factors, including low thermal conductivity of the substrates compared to the thermal conductivity of alumina, and the varied curing cycles that may be applied to cure multiple paste types in the case of thick film resistors.

Another parameter associated with measurement is probe type. Probe types can be varied to achieve better accuracy in measuring properties of a passive element. For example, in measuring the resistivity of a passive element one can choose a full Kelvin measurement in which four probes per passive element are utilized. That is, two sets of probes per passive element are utilized such that one set of probes is used to measure the resistivity of the element itself and the second set of probes is used to measure the resistivity of the probe contact itself. However, if probe contact is good, or if the resistance of the passive element is high compared to the resistance of the probe contacts, full Kelvin measurement is not required. Thus, only two probes would be required.

The sequence of measurement, trimming, and measurement is yet another parameter. As described above, in a conventional order of operations, a passive element is measured, for example, for resistance, then trimmed to a target resistance value while measuring the resistance of the element with the measurement circuit, and finally, a confirmation resistivity measurement of the element is taken. That is, the element is trimmed till the measurements indicate that the target value has been achieved, and then a final confirmation measurement is taken to determine the trimmed value. Measurement will be further discussed below.

Parameters associated with the manufacture of the passive elements themselves include properties of materials selected to form the element, i.e., the different pastes types discussed above. Another parameter is the steps in the manufacturing process, i.e., lamination, curing, and drilling as also discussed above. These steps may affect the performance of the passive elements.

Yet another parameter is the physical geometry of the passive elements themselves, i.e., length, width, and thickness. By choosing different combinations of lengths, widths, and thickness, the properties, i.e., resistance, capacitance, or inductance, of passive elements are changed. Further, passive devices having the same properties, but different physical geometries, respond to trimming process operations differently. Trim parameters are chosen for each different combination of passive element properties to mitigate the effect of these properties both on the initial trimming, and in drifting of the trimmed values after subsequent process steps (for example lamination).

Job Initiation

In order to prepare for trimming a PCB panel, a job description is communicated to the system controller 550. The controller 550 at least includes a processing unit such as a microprocessor and a memory associated therewith, such as memory 590. The memory and microprocessor are used in combination to store program steps for running the system 500, for storing and analyzing measurement date collected from the measurement of elements by the probe card 560 and video data collected from the camera system 552.

The job description comprises a digital file having a description of the size of the panel to be trimmed, a position within the panel of each element to be trimmed, the dimensions of the element, e.g. length and width, a description of the type of element to be trimmed, e.g. resistor, capacitor or inductor, thin film, thick film, or the like, and a target value of the element after trimming, e.g. one resistor may have a target value after trimming of 100 ohms. In addition to the target value of each different element to be trimmed, the job description may also include a desired target value distribution after trimming, e.g. +/−1% or +/−5% and these values may be different for different elements. Other parameters that may also be included in the job file include, so called, design rules, that may define restrictions placed on the position and or size of a trim cut with respect to the element dimensions, e.g. one rule may be that a trim cut must not exceed ½ the width of an element. Other job description data may include, details about the composition and the forming method of the elements to be trimmed, information about the substrate type and composition, information about the type of process that may be used after trimming and generally any other information about the panel and the elements to be trimmed that may be required to complete the trimming job or as will be discussed below, any information that may be used to optimize the trimming process.

In addition to the job file, a database of known information about trimming processes as they relate to various passive element types, to passive element and substrate types, to the performance of laser types, to wavelength, to trim speed, relating to the performance of various trimming cut types, to laser spot size and power, to measurement techniques and performance under various situations, passive element and substrate heating and cooling constants, characteristics of how passive element may change after trimming during subsequent lamination processes and generally any other information that may be usable to optimize the trimming process for the best result in the final PCB. This database will be stored in the system memory and the information stored therein will be used by the system controller 550 to select a suitable trimming process as demanded by the particular parameters relating to each element to be trimmed.

Target Performance

Figure 10:
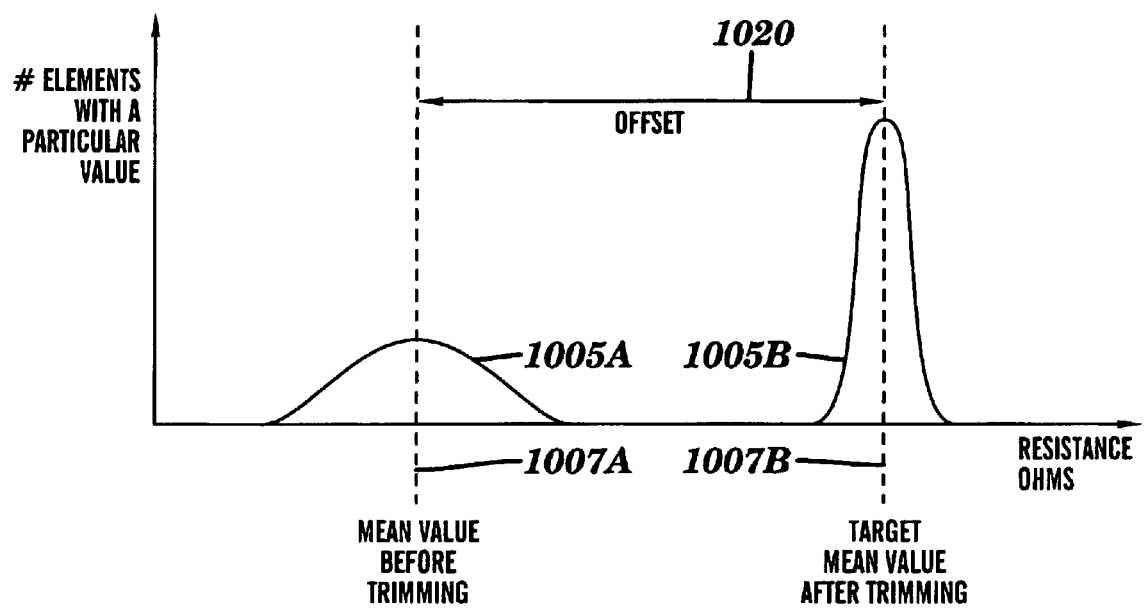
FIG. 10 depicts a distribution of values of a set of passive elements both before and after a trimming operation according to the present invention.

As will be further described below under the heading Operation, the trimming system 500 is used to measure initial values of each element to be trimmed. This operation is done sequentially for each new area of the panel placed under the lens field of view. However, it is also possible to pre-measure the entire panel to record all of the element initial values. The left side of FIG. 10 depicts a histogram of resistor resistivity values 1005A as measured by the probe card 560 before any trimming of the elements. The measured resistivity values represent a mean value 1007A of the resistivity of each resistor as applied to the PBC panel by whatever process was used for depositing the resistors thereon. The spread or range of resistivity values before trimming is represented by the distribution curve 1005A centered about the initial mean value 1007A. The mean resistivity value 1007A is representative of a single resistor type, e.g. having a mean value 1007A of 80 ohms and a distribution as applied to the panel of +/−20%.

A mean target value 1007B is depicted on the right side of FIG. 10 with a spread or distribution curve 1005B centered about the target value 1007B. The desired right side target value and distribution are included in the job file. In FIG. 10, the right side mean value 1007B and distribution 1005B may represent the desired outcome after trimming or the right side curve may represent actual measured values of each resistor element measured by the probe card 560 after trimming. In the present example, the target value 1007B may be 150 ohms +/−2%. Is will be recognized by those skilled in the art that a histogram such as is shown in FIG. 10 will be generated for each different type and value of passive element on the PCB panel. The present example has here been described for a resistor with a 150 ohm target value, however, hsitorgrams as shown in FIG. 10 will be generated for each different target resistor value e.g. one for all 1000 ohm resistors and a separate histogram for all 250 ohms resistors and other histograms for each different target capacitance or inductance value if capacitors and inductors are to be trimmed.

Any set of passive elements has a broad distribution of values, typically on the order of 10 to 50 percent, prior to trimming due to several reasons, typically related to the manufacturing process. As should be understood from the discussion in the Background section, there is often a local change of size of a given resistor printed on a substrate, such as a thickness. For large panels there is also a variance in other parameters within each panel, such as a distance between copper (conductive) traces, and thickness variation due to screen printing.

It is desirable to determine a trimming process or processes which will optimally bring the set of as applied passive element values very close to the desired target value such that all of the trimmed element values fall within the desired as trimmed spread 1005B. Each passive element is offset from the target value by an offset value 1008. As shown in FIG. 10, the offset value 1008 has a mean value which is the resistivity difference between the desired target value 1007B and the mean resistivity value before trimming 1007A which is determined by measuring each resistor. Dependent upon the mean offset value 1008 and the spread of the element before trimming 1005A, different processes may be chosen to achieve the target value 1007B and the desired spread 1005B. For example, if the offset value is close to the target value, the passive element should be trimmed at low speeds using particular types of cuts so that during the trimming process the element is not over trimmed, as will be further discussed below. Also for example, if the offset value is far away from the target value, for example, 50 percent or more, then the passive element would be trimmed utilizing different cuts, perhaps at different speeds, also as will be discussed below. For both small and great offset values, placement of cuts is dependent upon the type of resistor, the type of base used to form the resistor, and parameters associated with the laser as well. These parameters are known either from the job description file or from the database of information about trimming processes stored in the memory.

Substrate Damage

Figure 11:
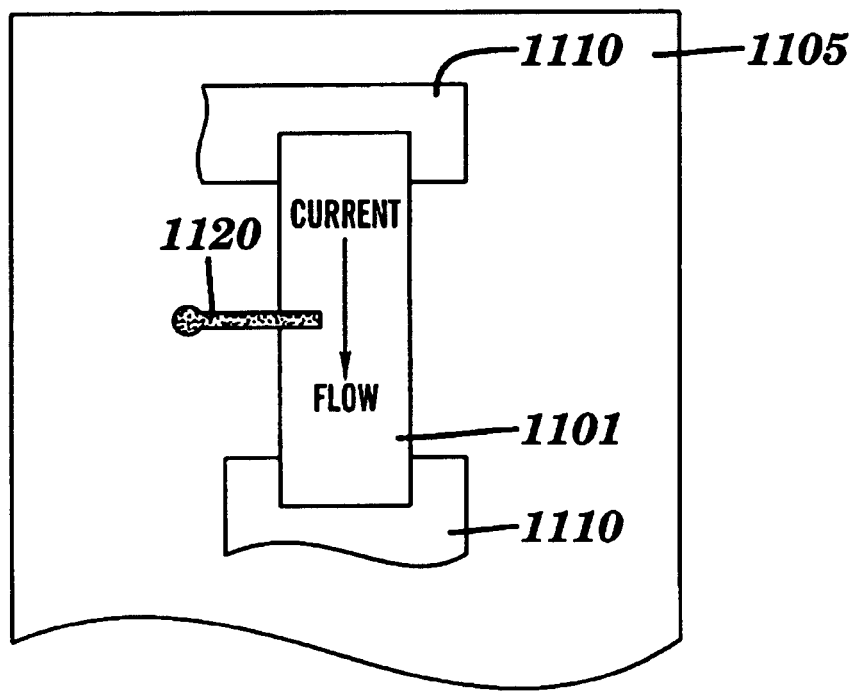
FIG. 11 is a depiction of an untrimmed passive element formed on a substrate showing a cut location and direction.

FIG. 11 is a simplified depiction of a passive element 1101 formed on a substrate 1105 and electrically connected to a copper trace 1110. As shown, a trim cut 1120 is typically made perpendicular to current flow through the passive element 1101. In a trimming operation, a laser beam 1120 starts the trim on the substrate 1105 before it reaches the passive element 1101 to begin ablation of the element 1101. This is to ensure that the resistor is fully addressed at an edge to completely cut through the edge of the resistor. In conventional applications, in which alumina or other ceramic substrates are utilized, this does not present a problem, as these substrates are very insensitive to the wavelengths and power of commonly used trimming laser beams. However, PCB substrates, such as FR4 or FR2 substrates, are sensitive to laser power and wavelengths. Care must be taken in choosing wavelength and power which will not damage such substrates.

As will be further discussed below, for trimming elements on PCB's, the laser wavelength may be chosen based upon the transmission spectrum of the substrate. One typical example of wavelength selection is a Nd:YAG laser which gives 1064 nm light, which does not damage FR4 even at the intensities typically used for trimming. Power selection will be discussed in detail further below.

Spatial Offset

Figure 12:
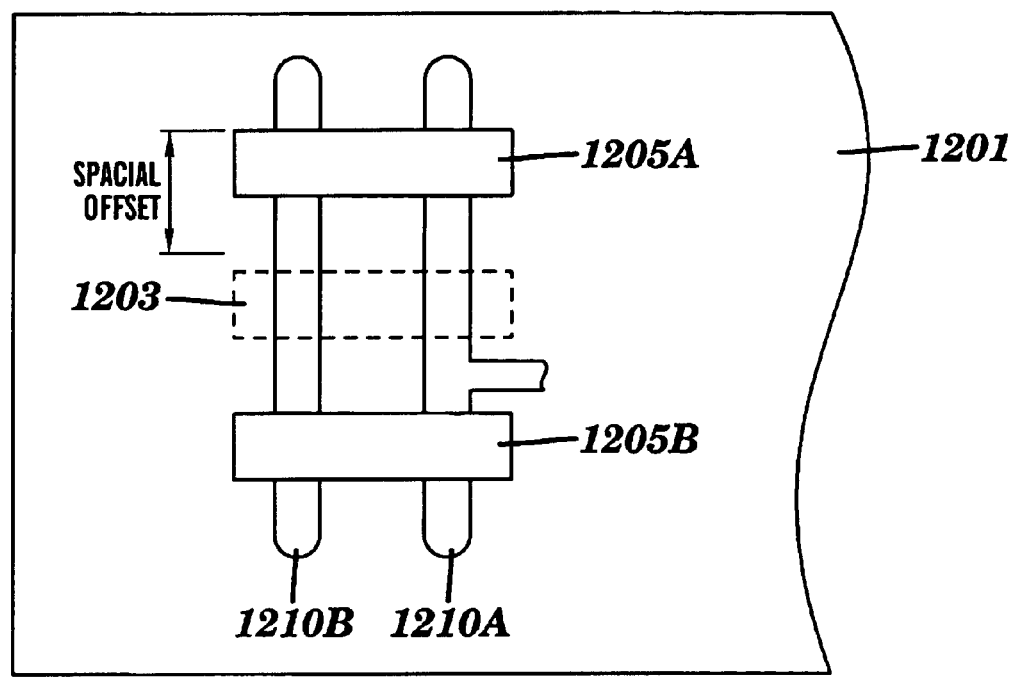
FIG. 12 depicts the offset distance of a passive element formed on a substrate.

FIG. 12 depicts a condition known as spatial offset which often arises when passive elements are formed on PCBs. A passive element is sometimes formed on a PCB in an unintended location. For example, as shown in FIG. 12, copper traces 1210A and 1210B are formed on a substrate 1201. An intended location of a passive element is shown in phantom at 1203 bridging the copper traces, while an actual location, 1205A or 1205B of the passive element may be offset from the intended location 1203. Spatial offset can occur because the PCB itself can distort during the manufacture process, and because of distortion of the materials used to manufacture passive elements, in addition to other reasons discussed in the Background.

PCBs are known to distort due to shrinkage during the curing and/or lamination stages of manufacture, as discussed above. This causes a misalignment when passive elements are placed on pre-defined locations on the substrate.

Introduced above, passive elements are often formed by the use of pastes. In such situations, spatial offset can occur because pastes can shrink during the manufacture process, typically during curing. Furthermore, when multiple layers are screen printed, alignment of the screen material can be slightly different between paste layers, which also introduces a spatial offset.

Figure 13A:
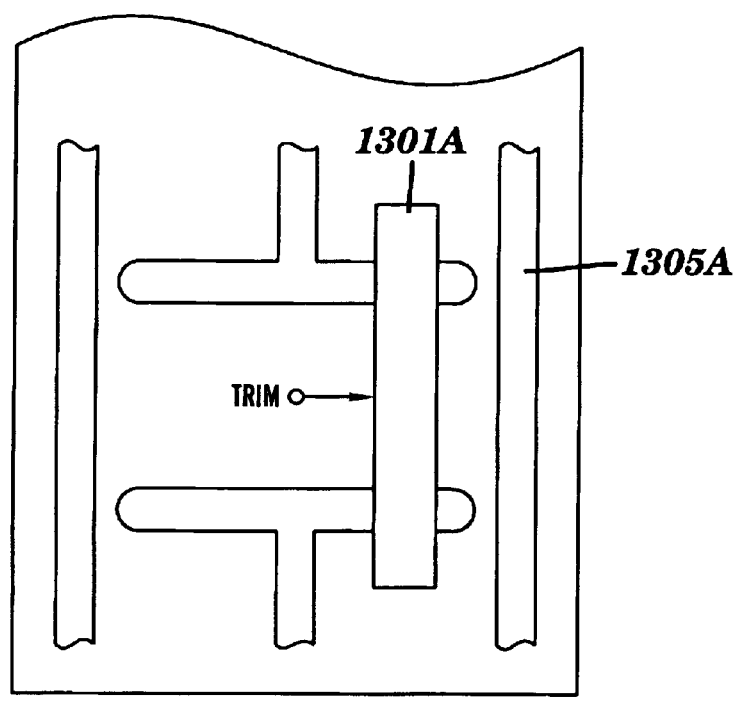
FIG. 13A is a first depiction of an offset passive element showing a preferred cut location according to the present invention.
Figure 13B:
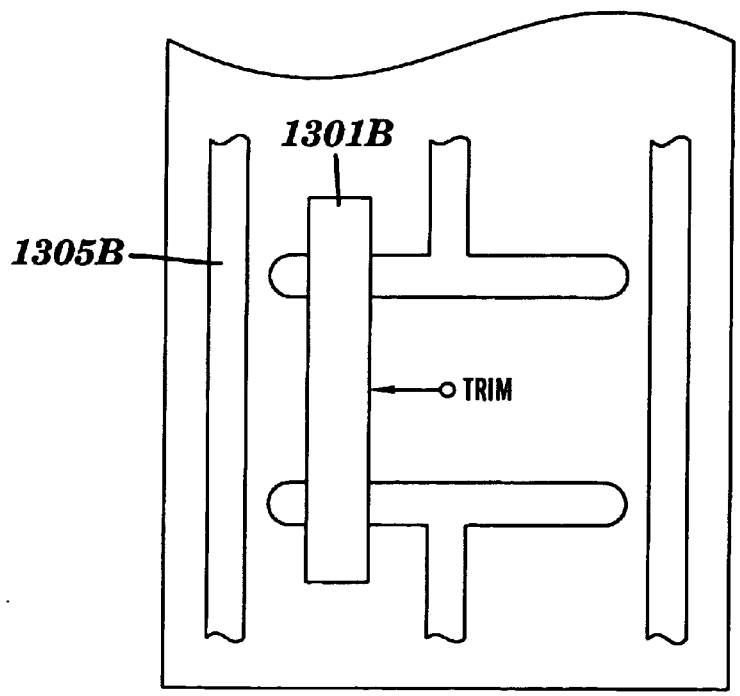
FIG. 13B is a second depiction of an offset passive element showing a preferred cut location according to the present invention.

Oftentimes spatial offset makes it difficult to trim a passive element due to adjacency of a passive element to copper traces or other circuit elements. FIGS. 13A and 13B are simplified depictions of spatially offset passive elements. In FIG. 13A, passive element 1301A is formed such that it is adjacent to copper trace 1305A. In FIG. 13B, passive element 1301B is formed such that it is adjacent to copper trace 1305B. As will be understood by one familiar with the art, a laser used to trim a passive element will damage a copper trace if it should come in contact with a copper trace. Thus, as shown, to avoid damaging copper trace 1305A, in FIG. 13A, a trim should begin on the left side of passive element 1301A and proceed to the right. Likewise, in FIG. 13B, a trim should begin on the right side of passive element 1301B and proceed to the left to avoid copper trace 1305B. As will be further discussed below, spatial offset is taken into account in determining the location, direction, and type of cut used to trim a passive element.

Operation

Figure 14:
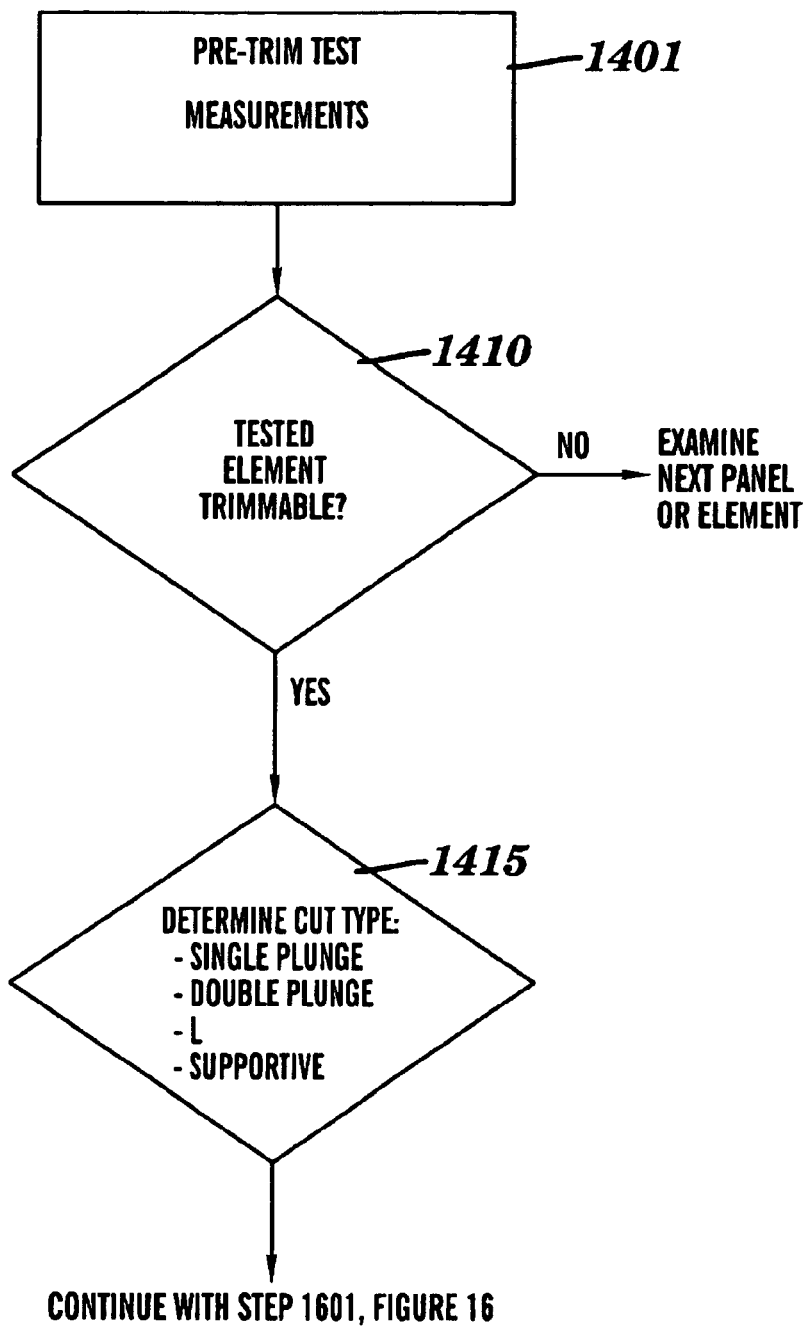
FIG. 14 is a first flow chart depicting operations of the present invention.
Figure 15:
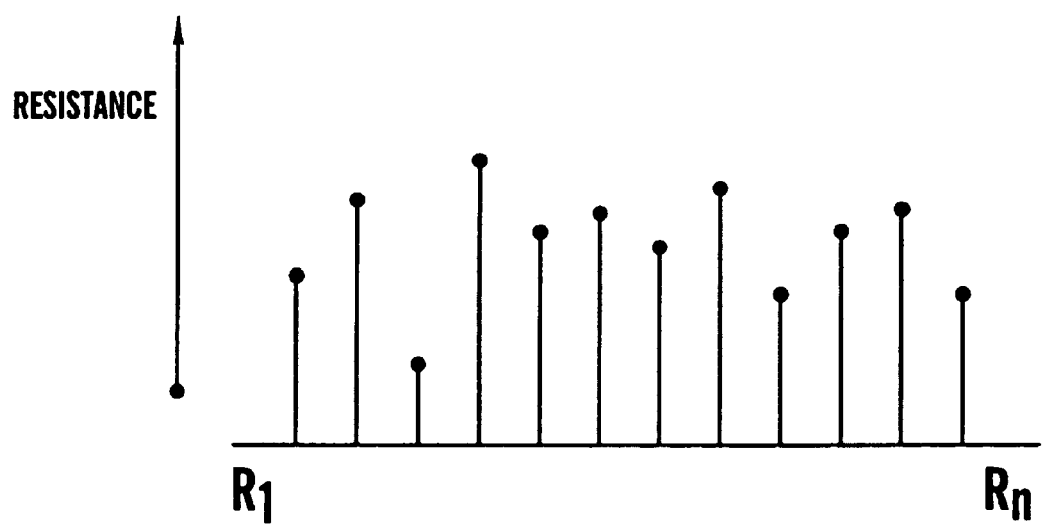
FIG. 15 depicts a distribution of measured resistance values of a set of passive elements.

In a typical operational sequence, the system controller 550 will issue stage control signals to direct the X-Y stages 542 to move in X and Y directions required to position a selected portion of the panel 540 under the lens field of view. This step will usually include determining an actual position and orientation of the panel 540 on the fixture 510, using the vision system, so that the system controller 550 has a reference position and orientation of the PCB panel. Once the actual position of the panel 540 is known, the system controller 550 will position one or more circuits within the field of view of the lens 520 for trimming the untrimmed circuit elements 578 that fall within the lens field of view. The system controller 550 will also issue probe control signals directing the probe card 560 to contact the work piece with the probes 562. As shown in step 1401 of FIG. 14, the system controller 550 will also issue a command to make an initial measurement of one or more circuit elements 578, to be trimmed, and to save the measured values in memory 590, or in one or more other memories. An exemplary depiction of a distribution of measured resistance values for a group of measured resistors $R_1$–$R_n$ is shown in FIG. 15 and the measured data may be used to from a histogram as depicted in FIG. 10 and analyzed by the system controller 550.

The system controller 550 then determines if it is possible to trim a given passive element in view of the location of that element, the initial measured value of the element or other factors in step 1410. That is, as discussed in relation to FIGS. 13A and 13B, an element may be offset such that it cannot be trimmed with the laser beam 522 without damaging other passive elements or circuitry. Other factors include a situation where the initial measured value is greater than the desired value. If the element cannot be safely trimmed, the entire panel may be rejected and removed or controller 550 may merely identify the element as rejected and move to the next element.

If the element can be trimmed, the system controller 550 compares the measured value of each circuit element prior to trimming with the desired target value of the element to determine an offset value. Based on the offset value and other factors, the system controller 550 determines the appropriate type of cut to achieve the target value and desired target value spread, based upon one or more of several factors. These factors include the geometry of the element, the passive element material type, the laser wavelength, power and spot size, the substrate type, element type and power requirements, step 1415.

For the required spread of the final resistance values (post trimming) of a resistor factor, if the as trimmed value of each resistor must be close to the target value, such as within one percent of the target value, then a double plunge cut or an L-cut can be selected because these cuts allow fine resistivity adjustments during the second trim cut which is usually slower while allowing a faster first trim cut to get the value close to the desired value. This selection optimizes the trim process by reducing the time required to make the full cut at a single slow speed. If the final value of the element does not need to be as close to the target value, such as within five percent of the target value, then a single plunge cut can be selected because it is a fast cut and can meet the desired outcome without slowing down to make fine resistivity adjustments.

For the amount offset of the measured value for the target value factor, if the offset value is large, then the serpentine cut can be selected. The serpentine cut is a fast cut that quickly removes material at a number of positions to greatly increase the resistivity of a resistor. If the offset is within a medium range, then the double plunge cut, L-cut, or single plunge cut can be selected because any of these cuts are optimal. If the offset amount is small, for example, within five percent of the target value, then either a single plunge cut or slow double plunge cut can be selected.

For the geometry of the element factor, if the length of the element is several times longer than the size of the laser beam diameter (spot size), then an L-cut or a double plunge cut can be selected. If the length of the element is small in comparison to the spot size, then it is difficult to make an L-cut or a double plunge cut due to a lack of material to ablate. In such a case, a single plunge cut can be selected. Thus in accordance with the invention, the system controller 550 may make a first selection of cut type based on the measured offset value and the required spread about the target value. However, in a second consideration, the system controller 550 may change the cut type selection based on a second criteria e.g. the element geometry because the element length is insufficient to perform a serpentine or L-cut. Also as a result of this analysis, the system controller may determine that there is no set of criteria that can trim the element and the element may be rejected as untrimmable.

For the power requirements of the element factor, if it is necessary for the element to conduct high current, which requires that the element dissipate a large amount of power (in the form of heat), then an L-cut can be chosen. If the element is a low current conducting element, then either a single plunge cut, double plunge cut, or serpentine cut can be selected.

Alternatively, instead of examining requirements for individual elements as a basis for determining cut type, a group of elements can be examined as a whole. In such a case, the offset distribution of that group from a target value can be examined, or the geometry of the elements within that group can be examined. A rule associated with group characteristics is then applied for determining a single cut type for the entire group. This has the benefit of better performance compared to just a uniform cut type over entire panel. This alternative has an lower level of complexity and a smaller time penalty then assigning different cut types for each element in the group.

Figure 16:
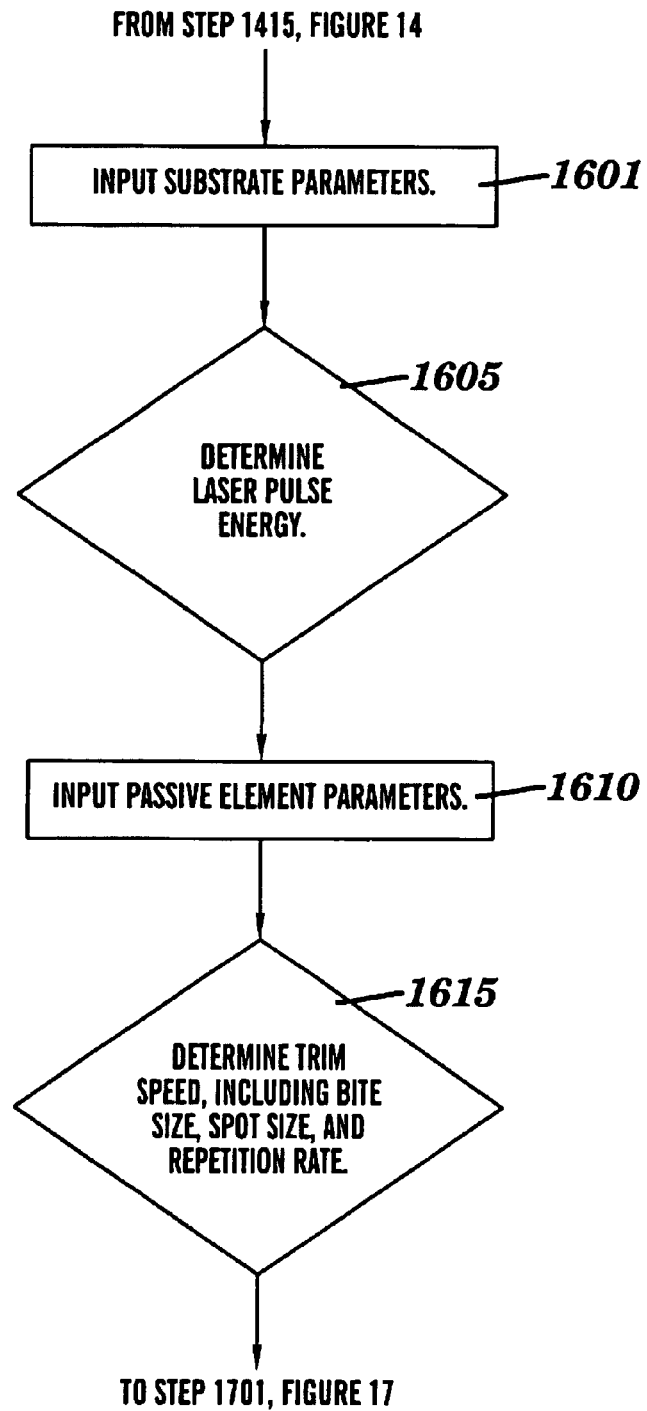
FIG. 16 is a second flow chart depicting further operations of the present invention.

Following determination of cut type, operations proceed as depicted in FIG. 16. FIG. 16 depicts the optimization of other parameters associated with the trim process. In particular, the pulse energy, the spot size, the bite size, and the laser repetition rate are optimized.

At step 1601, the substrate type and/or other substrate parameters is input to the system controller 550. Based upon resistance of the substrate type to damage from the laser, a laser pulse energy is selected, step 1605. The selected pulse energy will be the maximum pulse energy, or close thereto, which will not damage the substrate, yet yield the highest speed and best trimming performance. For example, a relatively easily damaged substrate, such as FR4 glass reinforced epoxy, would result in a low pulse energy being selected. On the other hand, a more damage resistant substrate, such as alumina or other ceramic, would result in selection of a higher pulse energy being selected. For example, for a FR4 substrate, a 20 kHz repetition rate with a 1 watt average power could be selected, and for an alumina substrate, a 30 kHz repetition rate with a 4 watt average power could be selected.

At step 1610 passive element parameters are input into the system controller 550, or may already be stored in the system database as discussed above. These parameters include how laser energy is conducted (in the form of heat) through the passive element. This parameter is dependent upon the type of paste used to form the element. Other parameters associated with the passive element are the geometry of the element as well as post lamination drift of the element. These parameters may be used to select bite size, spot size, and repetition rate, which one or more together determine trim (cut) speed step 1615. The selection may be based on previously tested and quantified trim processes and the resulting element values in the final PCB after post trimming lamination and processing.

For resistors, a higher resistance paste typically has a larger temperature coefficient of resistivity (TCR). Accordingly, if too much heat is introduced to a resistor formed from such a paste, the measurement of the resistance during the trimming process will by skewed by the heating caused by the laser power. Thus, a higher resistivity paste would require a lower trimming speed, the trimming speed being a combination of bite size, spot size, and laser repetition rate. The lower trim speed delivers less thermal energy per unit time. Conversely, a lower resistivity paste has smaller (TCR), which allows a faster trimming speed without seeing a bias on the measurement caused by the heating by the trimming laser of the resistor formed from such a paste.

The geometry of a passive element includes the thickness of the element. For a given trimming speed, to effectively remove thicker material, a greater average power, governed by pulse energy and repetition rate, is required as compared to thinner material. Other geometric aspects, such as the length or width of an element also affect the average power required for a given trimming speed.

Based upon measurements of post lamination PCB element values, trimming parameters can be selected such that trimming speed is varied to balance drift in component values caused by subsequent lamination or other processes in completing the manufacture of the PCB. The drift after lamination for a given cut type is measured, and then the trim parameters are changed. Then, another measurement is taken to see how the adjustment(s) affect post-lamination drift. Based upon the results of multiple such adjustments, optimized trim parameters are selected. It should be noted that this determination is not made based upon a single panel, but rather how a passive element type responds to lamination and trimming, and based on this collected group of responses, the trim parameters are adjusted to achieve the best possible results. The affects of these adjustments on the post-lamination drift ideally will be recorded in a database, perhaps stored in memory 590, to simplify the selection of trim parameters for optimizing the trimming process for other PCB designs.

The trim process can be adjusted to minimize the subsequent drift of the trimmed elements. By properly adjusting the trim process, the accuracy of trimmed passive circuit element values following the lamination process that embeds such elements into a work piece, can be substantially improved.

Depending on the drift characteristics of the resistor paste, one trim process may give better overall trim accuracy than another trim process. For example, the preferred trim process might provide a better balancing of the drift contribution from the trim process with that from the resistive paste. The drift optimization is factored in with other operational requirements, such as overall speed of the trimming, to determine the optimum trimming process.

As noted above, one important trim process factor is the rate of heat deposition by the laser beam. More particularly, by reducing the heat input to the passive circuit element during trimming, post lamination drift will also be reduced.

Additionally, different trim types, such as double plunge cuts or L cuts, also have different drift characteristics. Accordingly, by changing the type of cut being utilized for the trimming of the element, the post lamination drift will also be reduce.

The following Table I presents several possible scenarios showing how changes in the trim process will effect post lamination drift. It should be noted that the drift values in Table I are hypothetical and presented only to enhance the readers understanding of the present invention. It will be recognized by those skilled in the art that actual drift values can be easily measured and used in applying the invention as described herein to a particular trimming job.

TABLE I

| Case | Paste drift | "Fast trim L cut" drift | "Slow trim L cut" drift | "Double Plunge" drift | Final resistor tolerance | Optimum process | Importance of invention |
|---|---|---|---|---|---|---|---|
| 1 | +3% | +1% | −1% | −1% | 2% | Slow trim, Double plunge | High |
| 2 | +3% | +1% | −1% | −1% | 4% | Fast trim, double plunge | Moderate |
| 3 | +1% | +2% | +1% | +1% | 3% | Fast trim, L cut | Moderate |
| 4 | +1% | +2% | +1% | 0% | 4% | Fast trim | Not applicable |

TABLE I-continued

| Case | Paste drift | "Fast trim L cut" drift | "Slow trim L cut" drift | "Double Plunge" drift | Final resistor tolerance | Optimum process | Importance of invention |
|------|-------------|-------------------------|-------------------------|-----------------------|--------------------------|-----------------|-------------------------|
| 5 | −2% | +4% | +2% | +1% | 0% | Slow L cut, double plunge | High |

As discussed above, conventionally the trimming process factors have been selected to optimize the speed at which the trimming is performed. However if, for example, the trimming process for case 1 were optimized for speed, the desired final resistor tolerance would not have been achievable.

In case 2 or case 3, certain somewhat optimized trimming process factors for mitigating drift might have been selected by chance. For example, if there was some other reason to select a particular cut type, that cut might provide some optimization. However, even if this were the case, additional speed or yield improvements may still be achievable by selecting the best trim type or by optimizing another trimming process factor, such as the heat input by the laser beam to the element during trimming, to increase the process margin.

Case 5 is a particularly interesting example of an implementation in which no drift is allowed after lamination. As shown, initial indications are that untrimmed resistors have negative drift of about 4% after lamination. Laser trimmed resistors have positive, e.g. 4% to 8%, post-lamination drift. Thus, by choosing the correct trimming parameters the final drift can be reduced to substantially 0%.

It will be recognized that the trimming may be performed in multiple phases. That is, all passive elements may first be subjected to a rough trimming and then be subjected to a fine trimming after the rough trimmed elements have cooled.

Figure 17:
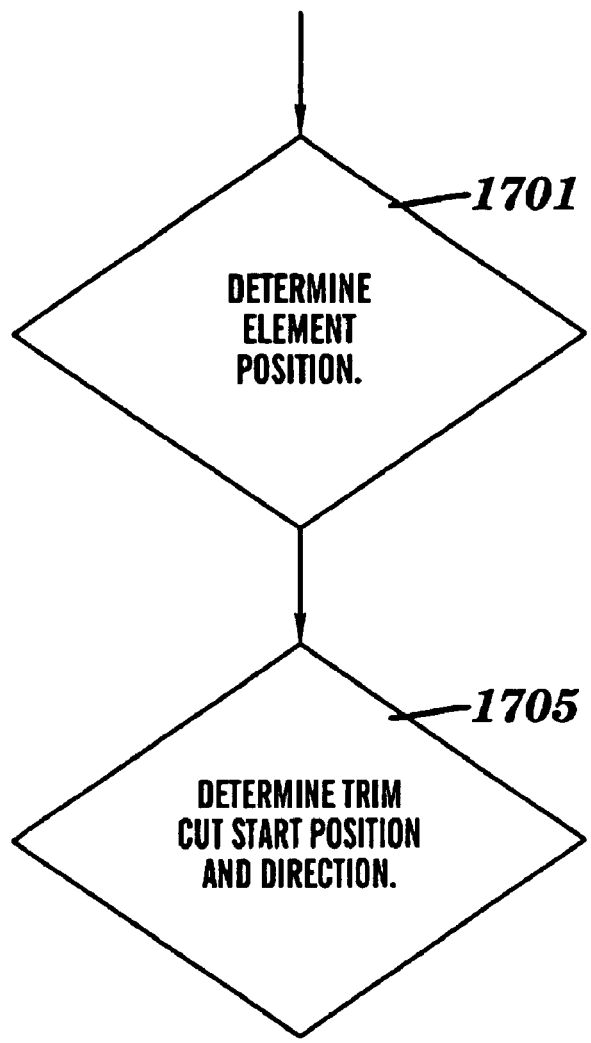
FIG. 17 is a third flow chart depicting still further operations of the present invention.

Following determination of trim (cut) speed (bite size, spot size, and repetition rate) in step 1615, operations continue with FIG. 17. In step 1701 the position of the element in relation to the any conductors (copper traces) is determined. Typically this is done by doing a global alignment (3 or 4 point alignment) to determine where the conductors are located, and then this information is superimposed with the alignment of the printed or etched passive elements. This can be done globally or locally, depending on relative shrinkage factors or stretch factors. The relative alignment of conductors to the passive elements may vary across different areas of the panel. Based on the local alignment or the local relationship between the passive elements and the conductors, a trim cut start point and direction is determined, step 1705, to avoid damage to adjacent circuit elements and conductors.

Figure 18:
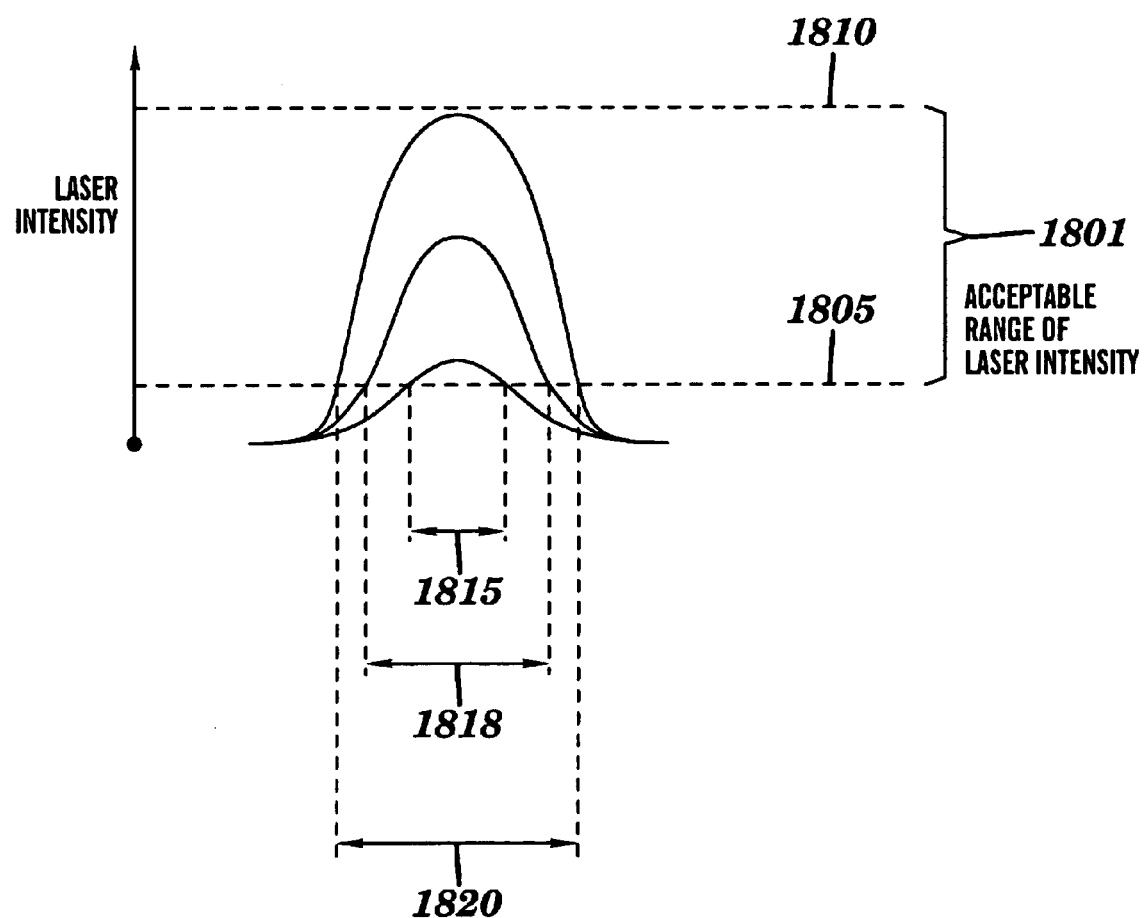
FIG. 18 depicts a preferred range of laser intensity according to the present invention.

With reference to FIG. 18, by changing the intensity of the laser beam 522, which in this case is done by just varying the pulse energy and nothing else, the portion of the beam that is above the threshold, or ablation point, of the passive element can be changed. A low energy pulse with relatively low intensity will only remove material from the center portion of the beam 522, resulting in a narrow kerf (cut width). As the pulse energy is increased, while the spot size remains the same, the portion of the beam area that exceeds the threshold for ablation will increase and the kerf width will increase. This increase can be maintained up until the threshold where the substrate itself starts to damage. Cut width could continue to increase further, but the substrate damage would be undesirable.

As shown in FIG. 18, an acceptable range for pulse energy 1801 lies between the ablation threshold 1805 and the threshold for substrate damage 1810. Low pulse energy results in a narrow kerf 1815, medium pulse energy results in a medium kerf 1818, and high pulse energy results in a wide kerf 1820.

Another choice that can be made at the system design level is the wavelength of the laser to avoid damage to the substrate over an acceptable range of laser intensities. Note that laser intensity is defined as the pulse energy divided by the beam area, and divided by the pulse duration. Beam area is the area enclosed by the laser spot size at the work piece. Pulse duration is variable between laser designs, but is not generally adjustable independent of pulse energy. An acceptable intensity range should be above the threshold for removing material, while remaining below the threshold for damaging the substrate. Dependent upon what the substrate is, a different wavelength may be ideal. Most desirable is the largest separation between the ablation threshold for the passive element material and the damage threshold to the substrate. Ideally, a wavelength will be chosen that gives the biggest possible separation between these two thresholds. Many conventional application wavelengths around 1 micron are suitable, but depending on the substrate material and the passive element material, wavelengths as long as 1.5 $\mu$m and as short as 0.25 $\mu$m may be appropriate for different combinations of substrate material and passive element material.

Choosing the wavelength correctly and choosing the pulse energy versus spot size correctly will yield the maximum possible process window in terms of acceptable variations in pulse energy for thickness before damage occurs or before there is a loss of control in the trimming process.

There are two factors which variable cut width addresses. The first is the ability to accommodate variations in material thickness. To achieve a constant trim, it is important to cut completely through the material, and if pulse energy is set too low, some cuts will not be complete cuts. Also, if the pulse energy varies because of normal laser power fluctuations, a complete cut may not be achieved. Secondly, it is important to control the cut width to achieve good electrical properties independent of whether the cut is complete. There may be some situations where an insufficiently wide kerf results in unpredictable changes in the passive element after lamination because of bridging or re-flow of the material after the actual trimming is complete.

Thus, by controlling the pulse energy while maintaining a constant spot size, the kerf size can be controlled, while avoiding damage to the substrate. Further, by selecting an appropriate laser wavelength, a maximum possible contrast between the ablation threshold and substrate damage threshold can be achieved.

Figure 19A:
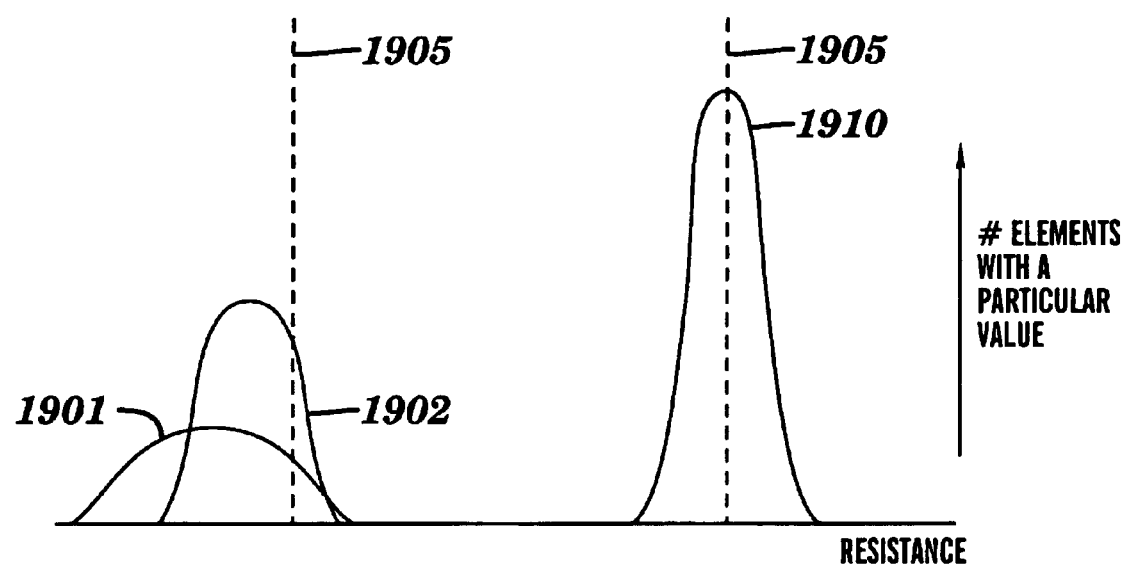
FIG. 19A depicts a target distribution of passive elements relative to a target value and a distribution of actual values of two sets of passive element relative to the target value before trimming operations according to the present invention.

FIG. 19A depicts a histogram with a typical distribution of fabricated thick film resistors 1901 and a typical distribution of thin film resistors 1902, each prior to trimming, in relation to a target value of resistance 1905. FIG. 19A also shows a target distribution or spread 1910 of such elements in relation to the target resistance 1905. As shown, both the distribution of the thick film resistors and the thin film resistors peak at points different than the target value. Thick film resistors typically have a much broader distribution of values before any trimming than the thin film resistors. Conventionally, each type of resistor is measured prior to, during, and after trimming, as described above. This has the disadvantage of being a slow process.

For thin film or thick film resistors, this process can be shortened. A sample of resistors, either on a panel basis, or on a batch basis, are measured prior, during, and after trimming. The most optimum trim parameters (cut type, laser pulse energy, spot size, bite size, and/or repetition rate) to achieve target values are determined from this sample. Once the parameters are determined, they are applied to the remaining resistors without any measuring at all.

Figure 19B:
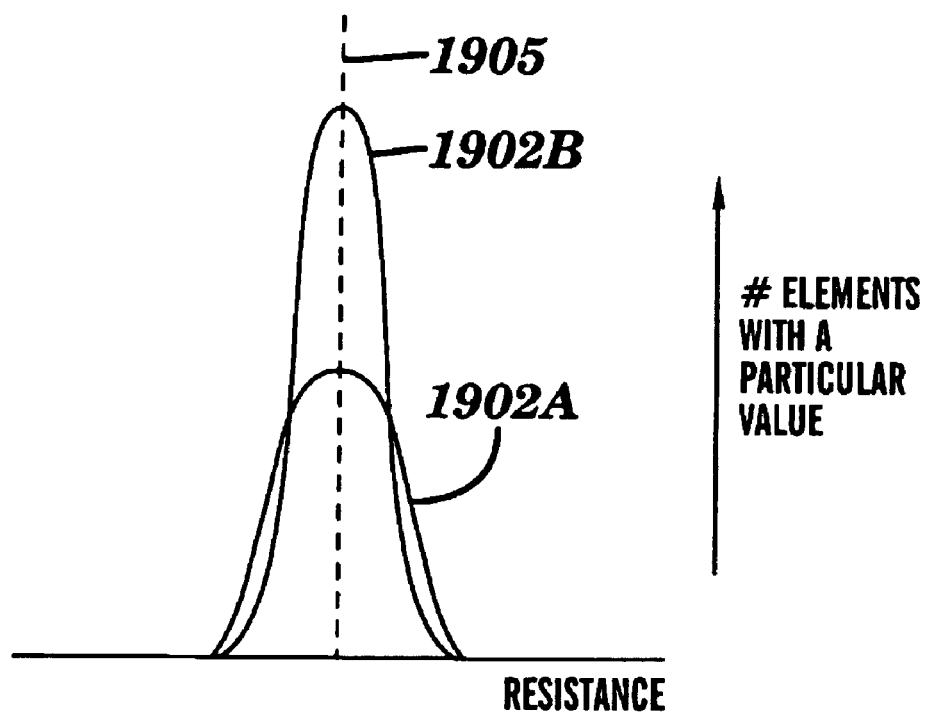
FIG. 19B depicts two distributions of one set of the passive elements of FIG. 19A after trimming according to the present invention.
Figure 20A:
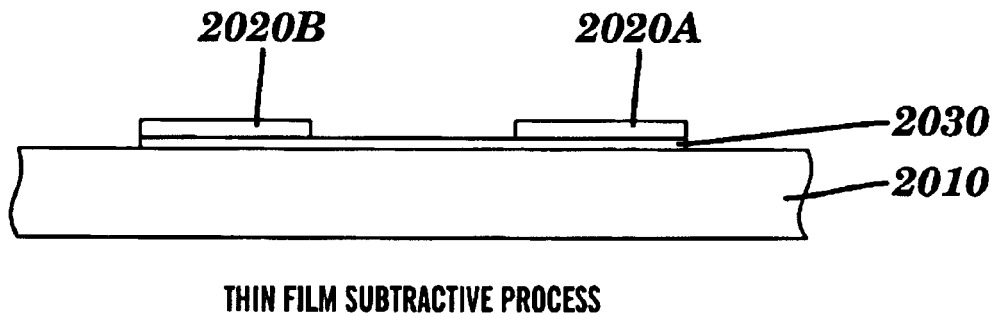
FIG. 20A depicts a conventional thin film resistor formed by a subtractive process
Figure 20B:
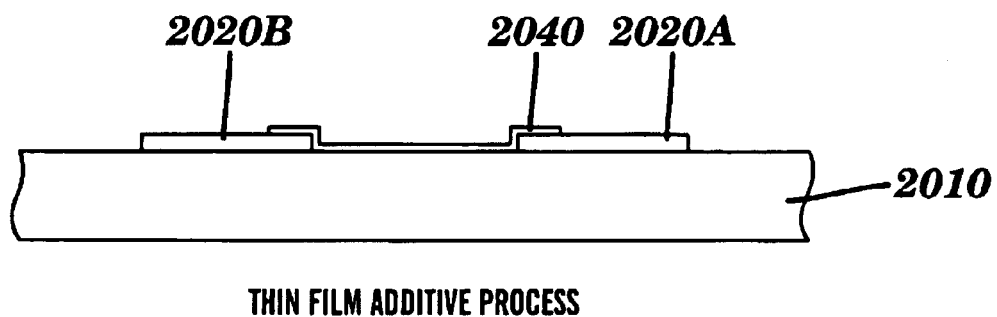
FIG. 20B depicts a conventional thin film resistor formed by an addative process.
Figure 20C:
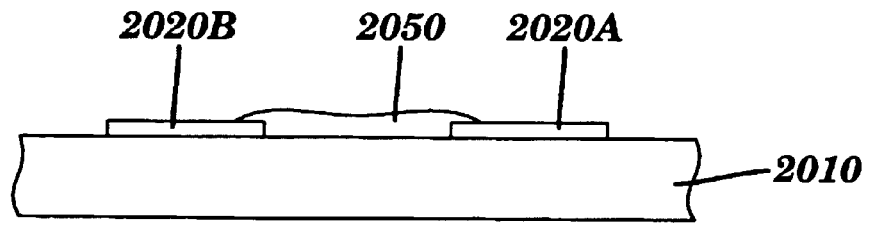
FIG. 20C depicts a conventional thick film resistor.
Figure 20D:
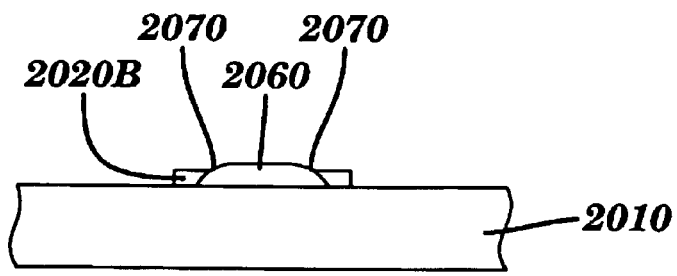
FIG. 20D depicts a first cross section along the width of a thick-film resistor.
Figure 20E:
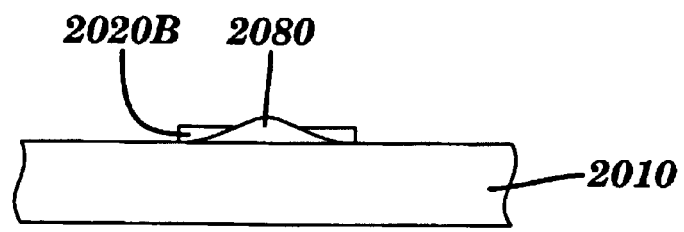
FIG. 20E depicts a second cross section along the width of a thick-film resistor.

As shown in FIG. 19B, this does not decrease the width of the distribution 1902A, but rather moves the distribution 1950 to peak over the target value 1905.

In cases in which the distribution width of the resistors before trimming is not acceptable, a further measurement and trimming step can be taken to narrow the spread. After determining a trimming process that consistently provides the desired target value and spread, as described above, the remaining resistors are measured to determine how much individual correction is required. Then, using interpolated parameters, the remaining resistors are trimmed. As an example of interpolation, the length of the second cut for a double plunge type trim can be increased in proportion to the measured offset from the target resistance. This has the benefit of adjusting for some variations in the geometry of individual resistors before trimming so that a narrow distribution is achieved, which is shown in FIG. 19B at 1902B.

After all parameters have been determined, the system controller 550 will then issue laser module control signals directing the laser beam delivery module 530 to first emit a laser light beam 522 along a first path to make one or more trim operations on a first of the untrimmed circuit elements 578 within the field of view, to then emit the laser light beam along a second path to make one or more trim operations on a second of the untrimmed circuit elements within the field of view, and to continue changing the path of the laser light beam until all of the other untrimmed circuit elements 578 within the field of view of the lens 520 are trimmed.

It will be recognized that the trimming may be performed in multiple phases. That is, all untrimmed circuit elements 578 within a field of view of the lens 520 may first be subjected to a rough trimming and then, without further movement of the panel fixture 510, be subjected to a fine trimming by the laser beam delivery assembly 530. Moreover, it will be recognized that more than one measurement circuit 572 may be provided for measuring any of resistance, capacitance or inductance and that the untrimmed circuit elements 578 may have a plurality of desired resistance, capacitance and inductance target values. In addition it will be recognized that a plurality of probe cards 560 may also be sequentially or simultaneously positioned over the field of view of the lens 520 to probe different circuit elements 578. This may be especially true if the circuit elements 578 are densely distributed and more than one probe card 560 may be used to probe different groups of circuit elements 578.

When all of the elements within the field of view of the lens are trimmed to the desired values, the system controller 550 issues stage control signals directing movement of the panel fixture 510 to locate the next untrimmed area of the of the panel 540 within the field of view of the lens 520 for trimming. This process is repeated until all of the untrimmed circuit elements 578 on the panel 540 have been trimmed, or until a desired subset of circuits numbering less than the total number of circuits on the panel have been trimmed. If all of the desired untrimmed circuit elements 578 on the panel have been trimmed, the controller 550 issues control signals to either stop the system 500 for manual removal of the panel 540 or to mechanically remove the trimmed panel 540 from the panel fixture 510 using an automatic panel handler, and to load a new untrimmed panel 540 onto the panel fixture 510.

It will also be recognized by those skilled in the art that, while the invention has been described in terms of one or more preferred embodiments, it is not limited thereto. Various features and aspects of the above described invention may be used individually or jointly. Further, although the invention has been described in the context of its implementation in a particular environment and for particular purposes, e.g. trimming of passive elements, those skilled in the art will recognize that its usefulness is not limited thereto and that the present invention can be beneficially utilized in any number of environments and implementations. Accordingly, the claims set forth below should be construed in view of the full breadth and spirit of the invention as disclosed herein.

We claim:

1. A method for selecting a parameter for use in laser trimming elments, comprising:

measuring a value of a parameter of each of plurality of elements;

comparing the measured parameter value of each element with a target value for the parameter to determine on offset value between the measured parameter value and the target value;

identifying additional parameters associated with each of the plurality of elements, wherein the identified additional parameters include at least one of a paste composition from which an element is formed and a subsequent manufacture processing step to which the element is subjected; and selecting a trim parameter based on the determined offset values and the identified additional parameters.

2. A method according to claim 1, wherein the element is one of a trimmed passive circuit element and an untrimmed passive circuit element and the plurality of elements include any of a plurality of resistors, a plurality of capacitors, and a plurality of inductors.

3. A method according to claim 1, wherein the trim parameter is at least one of a type of cut for trimming the element, a laser wavelength, and a speed at which the cut is made.

4. A method according to claim 3, further comprising:

emitting a laser beam to trim one of the plurality of elements in accordance with the selected trim parameter;

wherein the trim parameter is the cut speed;

wherein selecting the cut speed includes selecting at least one of a bite size of the trim and a repetition rate at which the laser beam is emitted.

5. A method according to claim 4, wherein selecting the cut speed includes selecting the bite size, and further comprising:

adjusting an intensity of the emitted laser beam by adjusting at least one of a spot size and a pulse energy of the emitted laser beam to correspond to the selected bite size.

6. A method according to claim 1, wherein the identified additional parameters further include at least one of a forming method of the element and a type of substrate on which the element is disposed.

7. A method according to claim 1, wherein the identified additional parameters further include a geometric parameter of the element.

8. A method according to claim 1, further comprising:
determining a relationship between a position of one of the plurality of elements and a position of an adjacent conductor;
determining a start point distance from the one element and a direction of movement from the start point based on the determined relationship; and
emitting a laser beam;
wherein the emitted laser beam is moved along a path from the determined start point in the determined direction to an impinge point on the one element, and from the impinge point to trim the one element in accordance with the selected trim parameter.

9. A method according to claim 1, further comprising:
identifying a first threshold laser beam intensity at which a laser beam impinging on a substrate, on which the plurality of elements are disposed, will damage the substrate;
identifying a second threshold laser beam intensity at which the laser beam impinging on one of the plurality of elements will cause ablation;
emitting the laser beam to trim the one element in accordance with the selected trim parameter;
wherein the emitted laser beam has an intensity within a range defined by the first and the second threshold laser beam intensities.

10. A method according to claim 9, wherein:
the selected trim parameter is a selected bite size;
the intensity of the emitted laser beam corresponds to the selected bite size.

11. A method according to claim 1, further comprising:
identifying a type of substrate on which the plurality of elements are disposed;
selecting a laser wavelength based the identified substrate type;
emitting the laser beam to trim the plurality of elements in accordance with the selected trim parameter;
wherein the emitted laser beam has the selected wavelength.

12. A method according to claim 11, wherein the wavelength is approximately 1 micron.

13. A method according to claim 11, wherein the wavelength is selected such that the emitted laser beam does not substantially damage the substrate.

14. A method according to claim 1, further comprising:
identifying a target distribution of offset values after trimming the plurality of elements; and
selecting the trim parameter based also on the identified target distribution.

15. A method according to claim 1, wherein each of the plurality of element is one or more multi-layer printed circuits boards.

16. A method according to claim 1, wherein, the subsequent manufacture processing step is at least one of lamination, curing, and drilling.

17. A method according to claim 1, further comprising:
determining a minimum cross-sectional area for a required operational current of one of the plurality of elements;
selecting the trim parameter for the one element to achieve at least the determined minimum cross-sectional area.

18. A method according to claim 1, wherein the plurality of elements is a plurality of trimmed elements, and further comprising:
emitting a laser beam to trim a plurality of untrimmed elements in accordance with the selected trim parameter.

19. A method according to claim 1, wherein the plurality of elements is a plurality of untrimmed resistors, and further comprising:
emitting a laser beam to trim the plurality of untrimmed resistors in accordance with the selected trim parameter;
measuring a change in the measured parameter value of each of the plurality of resistors during the trimming of that resistor;
again emitting the laser beam to trim another plurality of untrimmed resistors in accordance with the selected trim parameter and without measuring a value of the parameter of the other plurality of untrimmed resistors or a change in the value of the parameter during trimming of the other plurality of untrimmed resistors.

20. A method according to claim 1, wherein the plurality of elements is a plurality of untrimmed resistors, and further comprising:
emitting a laser beam to trim the plurality of untrimmed resistors in accordance with the selected trim parameter;
measuring a change in the measured parameter value of each of the plurality of resistors during the trimming of that resistor;
measuring a value of the parameter of each of another plurality of untrimmed resistors;
comparing the measured parameter value of each of the other plurality of untrimmed resistors with the target value to determine another offset value between the measured parameter value of each of the other plurality of untrimmed resistors and the target value;
selecting another trim parameter based on the determined other offset values; and
emitting the laser beam to trim the other plurality of untrimmed resistors in accordance with the other selected trim parameter and without measuring a change in the value of the parameter during trimming of the other plurality of untrimmed resistors.

21. A method according to claim 1, further comprising:
trimming each of the plurality of elements in accordance with the selected trim parameter to change the offset value determined by comparing the measured parameter value of that element with the target value.

22. A method according to claim 21, wherein, the trimming is a first trimming, and further comprising:
again measuring a value of the parameter of each of the first trimmed plurality of elements;
comparing the again measured parameter value of each element with the target value to determine another offset value between the again measured parameter value and the target value; and
determining if the other offset values are within a predefined range.

23. A method according to claim 22, further comprising:
selecting another trim parameter based on the determined other offset values, if the other offset values are determined to be outside the predefined range; and again trimming each of the plurality of elements in accordance with the other selected trim parameter to change the offset value determined by comparing the again measured parameter value of that element with the target value.

24. A system for selecting a parameter for use in trimming elements, comprising:

at least one probe configured to measure a value of a parameter of each of a plurality of elements; and a processor configured to compare the measured parameter value of each element with a target value for the parameter to determine an offset value between the measured parameter value and the target value, and to select a trim parameter based on the determined offset values and additional parameters including at least one of a paste composition from which each element is formed and a subsequent manufacture processing step to which each element is subjected.

25. A system according to claim 24, further comprising:

an emitter configured to emit a laser beam to trim one of the plurality of elements in accordance with the selected trim parameter:

wherein the trim parameter is a cut speed;

wherein the processor is further configured to select at least one of a bite size of the trim and a repetition rate at which the laser beam is emitted to select the cut speed.

26. A system according to claim 25, wherein:

the processor is further configured to select the bite size; and the emitter is further configured to emit a laser beam having an intensity corresponding to the selected bite size.

27. A system according to claim 24, further comprising:

an input device configured to input the additional parameters for use by the processor.

28. A system according to claim 27, wherein:

the input device is at least one of a user input device and a camera.

29. A system according to claim 24, further comprising:

a camera configured to generate image data corresponding to an image of one of the plurality of elements and an adjacent conductor;

an emitter configured to emit a laser beam to trim the imaged element;

wherein the processor is further configured process the generated image data to determine a relationship between a position of imaged element and a position of the imaged adjacent conductor, and to determine a start point distanced from the imaged element and a direction of movement from the start point based on the determined relationship; and wherein emitter is further configured to move the emitted laser beam along a path from the determined start point in the determined direction to an impinge point on the imaged element, and from the impinge point to trim the imaged element in accordance with the selected trim parameter.

30. A system according to claim 24, further comprising:

an emitter configured to emit a laser beam to trim one of the plurality of elements in accordance with the selected trim parameter;

a memory operatively coupled to the processor and configured to store a first threshold laser beam intensity at which the laser beam will damage a substrate on which the plurality of elements are disposed, and a second threshold laser beam intensity at which the laser beam will cause ablation of the one element;

wherein emitter is further configured to emit the laser beam with an intensity within a range defined by the stored first and the stored second threshold laser beam intensities.

31. A system according to claim 24, further comprising:

an input device configured to input an indication of a type of substrate on which the plurality of elements are disposed; and an emitter configured to emit a laser beam to trim the plurality of elements in accordance with the selected trim parameter;

wherein the processor is further configured to select a wavelength of the laser beam based on the identified type of substrate;

wherein emitter is further configured to emit the laser beam at the selected wavelength.

32. A system according to claim 24, wherein:

the processor is further configured to determine a target distribution of offset values after trimming the plurality of elements, and to select the trim parameter based also on the identified target distribution.

33. A system according to claim 24, further comprising:

a memory operatively coupled to the processor and configured to store at least one of the target value and the additional parameters.

34. A system according to claim 24, further comprising:

a camera configured to generate image data representing an image of one of the plurality of elements;

wherein the processor is further configured to process the generated image data to determine at least one geometric parameter of the one element, and to select the trim parameter for the one element based also on the determined geometric parameter.

35. A system according to claim 24, further comprising:

a memory operatively coupled to the processor and configured to store a required operational current for one of the plurality of elements;

wherein the processor is further configured to compute a minimum cross-sectional area of a portion of the one element based on the required operational current, and to select the trim parameter for the one element based also on the computed minimum cross-sectional area.

36. A system according to claim 24, wherein the plurality of elements is a plurality of trimmed elements, and further comprising:

an emitter configured to emit a laser beam to trim a plurality of untrimmed elements in accordance with the selected trim parameter.

37. A system according to claim 24, wherein the plurality of elements is a plurality of untrimmed resistors, and further comprising:

an emitter configured to emit a laser beam to trim the plurality of untrimmed resistors in accordance with the selected trim parameter;

wherein the probe is further configured to measure a change in the measured parameter value of each of the plurality of resistors elements during the trimming of that resistor; and wherein the emitter is further configure to again emit the laser beam to trim another plurality of untrimmed resistors in accordance with the selected trim parameter and without the probe measuring a value of the parameter of the other plurality of untrimmed resistors or a change in the value of the parameter during trimming of the other plurality of untrimmed resistors.

38. A system according to claim 24, wherein the plurality of elements is a plurality of untrimmed resistors, and further comprising:

an emitter configured to emit a laser beam to trim the plurality of untrimmed resistors in accordance with the selected trim parameter;

wherein the probe is further configured to measure a change in the measured parameter value of each of the plurality of resistors elements during the trimming of that resistor, and to measure a value of the parameter of each of another plurality of untrimmed resistors;

wherein the processor is further configured to compare the measured parameter value of each of the other plurality of untrimmed resistors elements with the target value to determine another offset value between the measured parameter value of each of the other plurality of untrimmed resistors elements and the target value, and to select another trim parameter based on the determined other offset values; and wherein the emitter is further configured to emit the laser beam to trim the other plurality of untrimmed resistors in accordance with the other selected trim parameter and without the probe measuring a change in the value of the parameter during trimming of the other plurality of untrimmed resistors.

39. A system according to claim 24, further comprising:

an emitter configured to emit a laser beam to trim each of the plurality of elements in accordance with the selected trim parameter to change the offset value determined by comparing the measured parameter value of that element with the target value.

40. A system according to claim 39, wherein:

the trimming is a first trimming;

the probe is further configured to again measure a value of the parameter of each of the first trimmed plurality of elements; and the processor is further configured to compare the again measured parameter value of each element with the target value to determine another offset value between the again measured parameter value and the target value, and to determine if the other offset values are within a predefined range.

41. A system according to claim 40, wherein:

the processor is further configured to select another trim parameter based on the determined other offset values, if the other offset values are determined to be outside the predefined range; and the emitter is further configured to again trim each of the plurality of elements in accordance with the other selected trim parameter to change the offset value determined by comparing the again measured parameter value of that element with the target value.

42. A system according to claim 24, wherein each of the plurality of elements is on one or more multi-layer printed circuits boards, and the subsequent manufacture processing step is at least one of lamination, curing, and drilling.

43. A system according to claim 24, wherein the subsequent manufacture processing step is at least one of lamination, curing, and drilling.

44. A method according to claim 24, wherein the identified additional parameters further include at least one of a forming method of each element and a type of substrate on which the elements are disposed.

45. A system for selecting a parameter for use in trimming each of a plurality of elements comprising:

a processor configured to compare a measured value of an element parameter with a target value for the element parameter to determine an offset value between the measured and target values, and to select a trim parameter based on the offset value and additional parameters including at least one of a paste composition from which the element is formed and a subsequent manufacture processing step to which the element is subjected.

* * * * *

UNITED STATES PATENT AND TRADEMARK OFFICE
CERTIFICATE OF CORRECTION

PATENT NO. : 6,875,950 B2  
APPLICATION NO. : 10/103317  
DATED : April 5, 2005  
INVENTOR(S) : Naumov et al.

It is certified that error appears in the above-identified patent and that said Letters Patent is hereby corrected as shown below:

Title page,  
Item 54, delete "AUTOMATED LASER TRIMMING OF RESISTORS", insert -- DRIFT-SENSITIVE LASER TRIMMING OF CIRCUIT ELEMENTS --

Item 73, delete "Nashua, NH", insert -- Billerica, MA --

Item 56 – References Cited – U.S. Patent Documents, insert  
-- 4,772,774 A  *  9/1988  Lejeune et al  
4,795,881 A   *  1/1989  Lejeune et al  
4,901,052 A   *  2/1990  Chapel, Jr. et al  
6,339,604 B1  *  1/2002  Smart  
6,534,743 B2  *  3/2003  Swenson et al --

Column 14,  
Line 4, delete "addative", insert -- additive --

Column 21,  
Line 41, delete "hsitorgrams", insert -- histograms --

Column 33,  
Line 48, delete "configured process", insert -- configured to process --

Signed and Sealed this

Twenty-sixth Day of December, 2006

JON W. DUDAS  
*Director of the United States Patent and Trademark Office*